United States Patent
Gabriel et al.

(10) Patent No.: US 8,656,584 B2
(45) Date of Patent: Feb. 25, 2014

(54) METHOD OF FABRICATING AN ELECTROMECHANICAL COMPONENT USING GRAPHENE

(75) Inventors: Jean-Christophe Gabriel, Quaix en Chartreuse (FR); Philippe Andreucci, Moirans (FR); Thomas Ernst, Morette (FR); Thierry Poiroux, Voiron (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 566 days.

(21) Appl. No.: 12/884,871

(22) Filed: Sep. 17, 2010

(65) Prior Publication Data

US 2011/0067985 A1 Mar. 24, 2011

(30) Foreign Application Priority Data

Sep. 18, 2009 (FR) ..................................... 09 56426

(51) Int. Cl.
*H05K 3/02* (2006.01)
*H05K 3/10* (2006.01)

(52) U.S. Cl.
USPC .......................... 29/846; 29/830; 310/40 MM

(58) Field of Classification Search
USPC ................ 29/592.1, 596, 830, 846; 200/181; 310/40 MM, 309
See application file for complete search history.

(56) References Cited

U.S. PATENT DOCUMENTS

| | | | |
|---|---|---|---|
| 4,943,750 A * | 7/1990 | Howe et al. .................... 310/309 |
| 6,404,028 B1 | 6/2002 | Hetrick et al. | |
| 7,015,142 B2 | 3/2006 | DeHeer et al. | |
| 7,239,054 B2 * | 7/2007 | Takada et al. ................... 29/596 |
| 8,337,141 B2 * | 12/2012 | Carter et al. ............ 310/40 MM |
| 2004/0004485 A1 | 1/2004 | Lee et al. | |
| 2009/0020399 A1 | 1/2009 | Kim et al. | |

FOREIGN PATENT DOCUMENTS

| | | |
|---|---|---|
| GB | 2 422 638 | 8/2006 |
| WO | WO 01/16054 A2 | 3/2001 |
| WO | WO 2005/008708 A2 | 1/2005 |
| WO | WO 2006/090400 A2 | 8/2006 |
| WO | WO 2007/119123 A2 | 10/2007 |
| WO | WO 2009/102902 A2 | 8/2009 |

OTHER PUBLICATIONS

U.S. Appl. No. 13/190,125, filed Jul. 25, 2011, Ernst, et al.
Preliminary Search Report issued Jun. 14, 2010 in French Application No. 0956426.

(Continued)

*Primary Examiner* — Donghai D Nguyen
(74) *Attorney, Agent, or Firm* — Oblon, Spivak, McClelland, Maier & Neustadt, L.L.P.

(57) ABSTRACT

Method of fabricating an electro-mechanical microsystem provided with at least one fixed part comprising a bar, and at least one mobile part in rotation around at least one portion of said bar, the method comprising the steps of:
  a) formation, inside a layer of at least one given material resting on a support, of at least one bar,
  b) formation around the bar of at least one first graphene sheet, and of a least one second graphene sheet, separated from the first sheet and mobile with respect to the first sheet.

13 Claims, 30 Drawing Sheets

(56) References Cited

OTHER PUBLICATIONS

Claire Berger, et al., "Ultrathin Epitaxial Graphite: 2D Electron Gas Properties and a Route toward Graphene-based Nanoelectronics", J. Phys. Chem. B, vol. 108, 2004, pp. 19912-19916.

I. Forbeaux, et al., "High-temperature graphitization of the 6H-SiC (0001) face", Surface Science, vol. 442, 1999, pp. 9-19.

Samuel A. Alterovitz, et al., "Rapid Thermal Annealing of Amorphous Hydrogenated Carbon (a-C:H) Films", 1987 Spring Meeting of the Materials Research Society, NASA Technical Memorandum 89859, Apr. 21-25, 1987, pp. 1-6 (with two additional pages).

A. Reyes-Mena, et al., "Electrical conductivity of as-prepared and annealed amorphous hydrogenated carbon films", Journal of Vacuum Science Techonology, vol. 8, No. 3, May-Jun. 1990, pp. 1509-1513.

K. Yasuda, et al., "Annealing Effects in Amorphous Hydrogenated Carbon Films Prepared by Plasma Deposition from Butane Gas", Phys. Stat. Sol., vol. 95, 1986, pp. 249-254.

\* cited by examiner $410_1$  $410_n$ $410_1$  $410_n$

METHOD OF FABRICATING AN ELECTROMECHANICAL COMPONENT USING GRAPHENE

TECHNICAL AREA

The present invention relates to the area of electro-mechanical microsystems (MEMS) and/or nanosystems (NEMS).

It concerns a method of implementation of an electro-mechanical component, for MEMS or NEMS, equipped with at least one fixed element forming a rotational axis and at least one mobile element rotating around the fixed element.

It brings improvements in terms of reliability and of robustness, while allowing components of small size to be conceived in which frictional phenomena are improved, and the forces necessary for operating the mobile element are reduced.

The invention facilitates the operation and/or the maintaining of the mobile element in a stable position.

The invention is applicable in many fields such as optical or electrical or mechanical switches, micro- or nano-motors, micro- or nano-turbines.

PRIOR ART

MEMS or NEMS are systems comprising one or more mechanical elements, using electricity or heat as a source of energy, so as to develop a function as a detector and/or an actuator, and are equipped with at least one structure having micrometric dimensions in the case of a microsystem, or nanometric in the case of a nano-system.

MEMS or NEMS systems can be fabricated using techniques coming from the large scale production of microelectronics.

It is known how to make micro-components or nano-components equipped with an element or a part forming an axis of rotation around which a mobile part moves.

Document WO 01/16054 A2 discloses such a type of component, in the form of a micro-motor equipped with a fixed part forming a horizontal axis of rotation equipped with a central blade rotating around said element. This fixed part is made using a nanotube.

The nanotube is either fabricated separately, then deposited onto a substrate, or can be produced by catalytic growth.

In both cases, the production of such an element is problematic.

It is namely difficult to control the diameter of the nanotube, and when a plurality of nanotubes must be fabricated, it is difficult to control the dispersion between the respective diameters of the carbon nanotubes.

As a result of this, the fabrication of elements located around the fixed part or parts of the component, is delicate.

In the case of fabrication by depositing a nanotube forming an axis of rotation, an exact positioning of this nanotube is equally difficult to obtain, and generally requires an appropriate surface treatment or the fabrication of an appropriate receptacle such as a groove. Without such a receptacle or such a treatment, the symmetrical positioning of the nanotube with respect to the two anchoring points of same, is problematic.

In addition to the problem of positioning the nanotubes, the fabrication of a device comprising a plurality of carbon nanotubes forming each an axis of rotation, is a problem.

Indeed, the deposition of nanotubes generally requires the addition of catalysts, the implementation of which is not always compatible with some of the other steps of the fabrication method.

When the nanotube is produced by catalytic growth, the mechanical interfaces with the anchoring points can be made fragile because of the use of such an external catalyst.

On the other hand, the implementation of an axis of rotation using nanotubes is a problem at the anchoring points, since the latter can be points of mechanical weakness of the structure, the contact surface of a nanotube at the anchoring points thereof being reduced.

An axis of rotation formed by a nanotube can also prove insufficiently rigid for certain applications requiring the fabrication of a mobile part having a significant weight and can lead to the flexing of the nanotube and therefore to a poor control of the rotation and to poor performances of the motor.

The fabrication of a micromotor with an axis of rotation formed by a nanotube is also difficult for the production of electrical connections.

The problem addressed is that of implementing an electro-mechanical component for microsystems or nanosystems with a fixed part forming an axis of rotation and provided with a mobile part, namely improved in terms of robustness and reliability.

DESCRIPTION OF THE INVENTION

The invention firstly relates to a method of fabricating an electro-mechanical microsystem provided with at least one fixed part comprising a bar, and at least one mobile part in rotation around at least one portion of said bar, the method comprising the steps of:

a) formation, inside, or from, a layer of at least one given material resting on a support, of at least one bar, b) formation around the bar of at least one first graphene sheet, and of a least one second graphene sheet, separated from the first sheet and mobile with respect to the first sheet.

Such an arrangement of the graphene sheets enables a component to be formed in which frictional phenomena are limited.

Such an arrangement of the graphene sheets enables a component to be formed in which the phenomena of torsion of the bar forming an axis of rotation are suppressed or strongly reduced.

By avoiding the effect of torsion of the bar, the actuating/operation becomes easier. Actuating/operation, and/or holding of a component in a stable position are enabled by the implementation of forces with weaker intensity than same in devices according to the prior art, in which a torsion of an element playing the role of an axis of rotation is necessarily implemented.

An etching of said layer of said given material is made in order to form said bar. The bar thus formed is massive or solid.

The given material can be a material on which graphene growth can be produced or from which graphene can be formed by decomposition of the given material.

The given material can be SiC or copper (Cu) or Nickel (Ni) or iridium (Ir) or platinum (Pt) or ruthenium (Ru) or Palladium (Pd).

Preliminary to step b), one can form a material on which graphene growth can be produced or from which graphene can be formed.

The chosen material can be amorphous carbon.

According to a first embodiment, the bar can be produced during step a), so as to form a non-zero angle, in particular a 90° angle, with respect to the main plane of support.

Following step a), and preliminary to step b), the etching of the bar in order to provide same with a flared shape from the base of same towards the top thereof.

According to a second embodiment, the bar formed during step a) can be parallel to the main plane of support.

The bar can then be formed so as to be attached to at least one area of an anchoring block, said area belonging to said layer of the given material. This enables a robust anchoring of the bar to be achieved.

The bar can be formed through a masking block with a critical dimension larger than the dimension of the bar and this masking block is conserved when the graphene sheets are formed, the graphene covering this mask. This enables a robust anchoring of the mobile part to be achieved.

The method can, in addition, comprise: the formation on the bar of at least one element of the mobile part rigidly attached to the second graphene sheet.

This element can be, e.g. one or more blades, e.g. metallic blades.

The method can comprise, in addition, between step a) and step b), at least one step consisting of rounding the profile of the bar.

According to a possible embodiment of the graphene sheets, at least one of said sheets can form a continuous layer around the bar.

The sheets can be formed so that the perimeter of the bar comprises a plurality of distinct sheets.

The invention also foresees the fabrication of a micro-switch (or nano-switch), or a micro-motor (or a nano-motor), or micro-turbine (or a nano-turbine) using a method such as previously defined.

The invention relates, in addition, to a device embodied using a method such as previously defined.

The invention relates, in particular, to an electro-mechanical system of the MEMS or NEMS type, provided with at least one electro-mechanical component comprising:
- at least one fixed part comprising a bar forming an axis of rotation, the bar being provided with a central part made of at least one given material coated in at least one first graphene sheet,
- at least one fixed part rotating around the said axis of rotation of the bar, the mobile part comprising at least one second mobile graphene sheet rotating around at least one portion of said bar coated in the first sheet.

According to a first embodiment, the bar can make a non zero angle, in particular a 90° angle, with the main plane of the support.

The bar can include a base resting on the support, the bar having a flared shape from the base towards the top thereof.

According to a second embodiment, the bar can be parallel to the main plane of the support.

In this case, according to a possible embodiment, the bar can include at least one end linked to an area of the fixing block resting on the support, said area and the bar belonging to the same layer of material. A more robust anchoring can therefore be obtained.

A maintaining and/or protection element can be provided on the top of the bar.

The mobile part can comprise one or more mobile elements such as blades, rigidly attached to a second graphene sheet and rotationally mobile around the bar.

BRIEF DESCRIPTION OF THE DRAWINGS

The present invention will be better understood when reading the description of given examples of embodiment, for information only and not at all limiting, making reference to the attached drawings in which.

Identical, similar or equivalent parts of the various figures have the same numerical references so as to facilitate passing from one figure to another.

The different parts shown on the figures are not necessarily shown according to a uniform scale, in order to make the figures clearer.

DETAILED DESCRIPTION OF PARTICULAR EMBODIMENTS

A first example of an embodiment of an electro-mechanical component according to the invention, for an electro-mechanical system, will now be given in relation to FIGS. 1A-1J (FIGS. 1A-1J show a cross-sectional view of the component during fabrication).

By an electro-mechanical system, we understand here a micro electro-mechanical system currently called "MEMS" or a nano electro-mechanical system (NEMS) integrating on a chip or a substrate, at least one electro-mechanical component provided with one or a plurality of elements or parts with micrometric or nanometric size.

A first layer 102, based on a given material 103, is first made.

The support 100 can be a substrate, or an upper layer of a stack of layers resting on a substrate. The support 100 can be, e.g. a layer of bulk substrate based on Si, or of semiconductor on insulator type substrate such as SOI substrate (SOI for "Silicon on Insulator"), or, e.g. a layer of SiC on bulk Si, or, e.g. a layer of SiC substrate on oxide (SiCOI).

The given material 103 can be a material on which, or from which, graphene can be formed.

The given material 103 can be chosen to be compatible with a growth of graphene sheets, and/or a material at least some thickness of which can be treated, e.g. using annealing, so as to be decomposed and transformed into a stack of a plurality of graphene sheets.

The given material 103 can be, e.g. SiC or copper (Cu) or Nickel (Ni) or iridium (Ir) or platinum (Pt) or ruthenium (Ru) or Palladium (Pd).

Figure 1A:
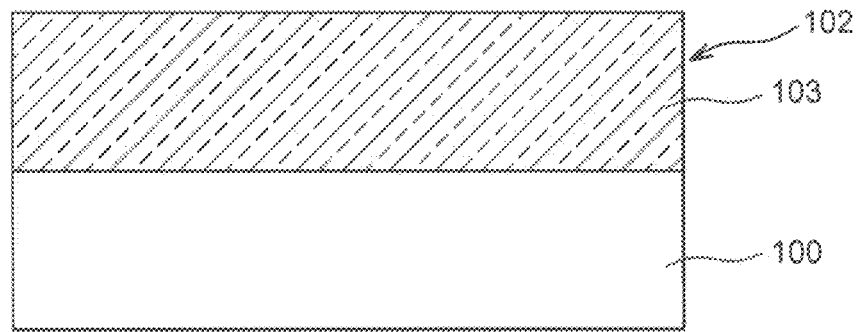
FIGS. 1A-1J illustrate a first example of method of fabrication on a support of an electro-mechanical component according to the invention, provided with an axis of rotation, orthogonal to the support.

The first layer 102 can have a thickness comprised between, e.g. a few nanometers and a few tens of micrometers, e.g. comprised between 100 nanometers and 20 micrometers (FIG. 1A).

Figure 1B:
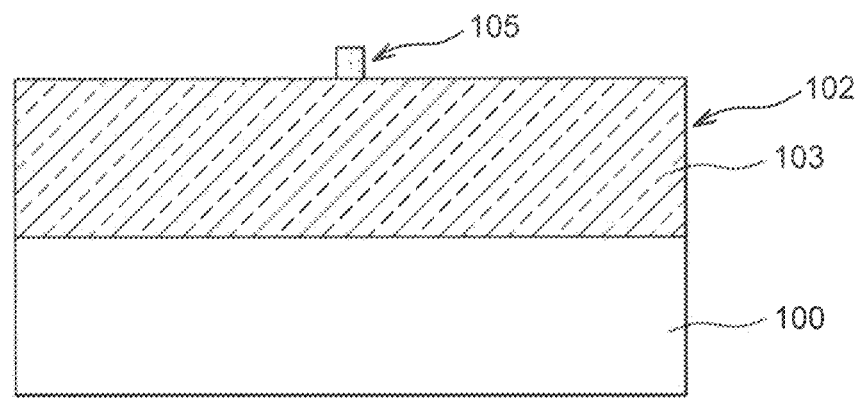
Figure 1C:
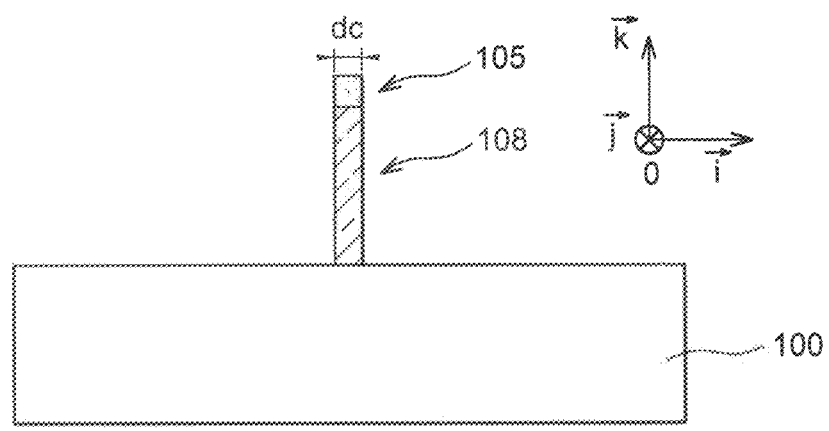
Figure 1D:
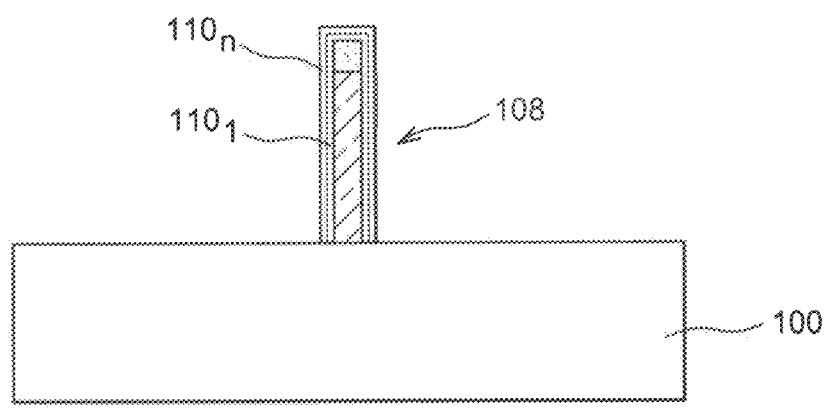

A mask 105 is then formed on the first layer 102, e.g. by depositing a masking layer, e.g. made of $Si_xN_y$, or of resin or of silicon oxide $Si_xO_y$, then the masked layer is etched to define one or more patterns of the mask (FIG. 1B).

One or more elements of an electro-mechanical component are then produced inside the layer 102 of the material 103, of which at least one bar 108 based on the given material 103, this bar being intended to form a fixed part of the electro-mechanical component, and in particular to form an axis of rotation for this component.

The bar 108 extends along a direction making a non zero angle, which can be of 90° or close to 90°, with the main plane of the support 100, (the main plane of the support 100 being defined as a plane passing through the latter and which is parallel to a plane [O; $\vec{i}$; $\vec{j}$] of an orthogonal coordinate system [O; $\vec{i}$; $\vec{j}$; $\vec{k}$] shown in FIG. 1C).

The bar 108 can be formed with a critical dimension dc, defined as the smallest dimension of the bar 108 and measured here in a plane parallel to the main plane of the support 100, can be comprised between a few tens of nanometers and a few tens of micrometers, e.g. comprised between 20 nanometers and 100 nanometers in the case where a nano-system is built, or e.g. between 1 micrometer and 10 micrometers in the case where a micro-system is built. The critical dimension dc can be adapted depending upon the intended application and the mass that the bar 108 is intended to support.

The bar 108 can be produced by anisotropic etching of the first layer 102 through the mask 105, e.g. using electron beam lithography followed by plasma etching. This etching can be carried out down to the support 100.

The mask 105 is then removed.

A rounded profile can then be given to the bar 108 or the bar 108 can be rounded, for example, when the latter is based on SiC, by etching under $H_2$ or by annealing under a hydrogen atmosphere at a temperature, comprised, for example, between 700° C. and 1200° C.

Then, a stack of a plurality of layers, or of n graphene sheets $110_1 \ldots 110_n$ with n≥2, is formed on the element 108. The sheets $110_1 \ldots 110_n$ are formed so that at least one first sheet $110_1$, and at least one second sheet $110_2$ on the first $110_1$, cover the bar 108 of the given material 103. The number n of sheets formed can be comprised, e.g. between 2 and 10, or, e.g. between 2 and a few tens, or e.g. between 2 and a few hundreds. The graphene sheets $110_1 \ldots 110_n$ can each be constituted of a monolayer of carbon atoms which can be of the order of 3 Ångströms in thickness or possibly a few monolayers of carbon atoms.

The graphene sheets $110_1 \ldots 110_n$ can be formed via graphenisation of a material deposited on the given material 103 or via graphenisation of a certain thickness of the given material 103.

The given material 103 can be, for example, SiC or copper (Cu) or Nickel (Ni) or iridium (Ir) or platinum (Pt) or ruthenium (Ru) or Palladium (Pd).

Graphenisation, can be, e.g. a SiC graphenisation carried out as described in the document: <<*Ultrathin Epitaxial Graphite: 2D Electron Gas Properties and a Route toward Graphene-based Nanoelectronics*>>, Berger et al., American Chemical Society 2004, or in the document: Forbeaux et al., Surf. Sci 442, 1999, or in the document U.S. Pat. No. 7,015,142 B1.

According to another possibility, the graphene sheets $110_1 \ldots 110_n$ can be formed on the layer of the given material 103, by growth on the given material 103.

Figure 2A:
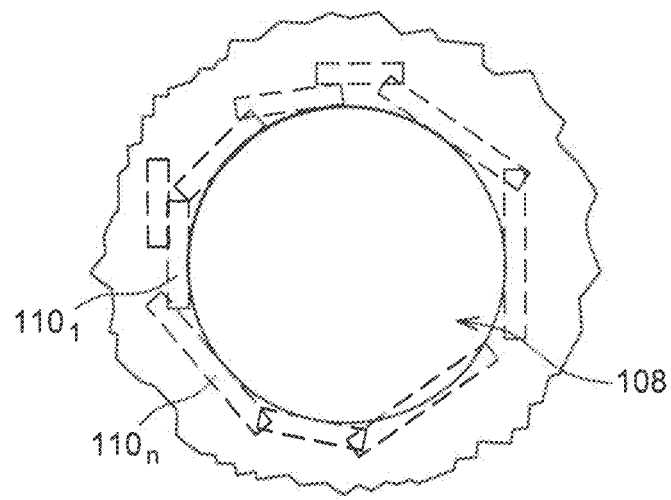
FIGS. 2A-2B illustrate a structure at the interface between a fixed part and a mobile part of an electro-mechanical part according to the invention.
Figure 2B:
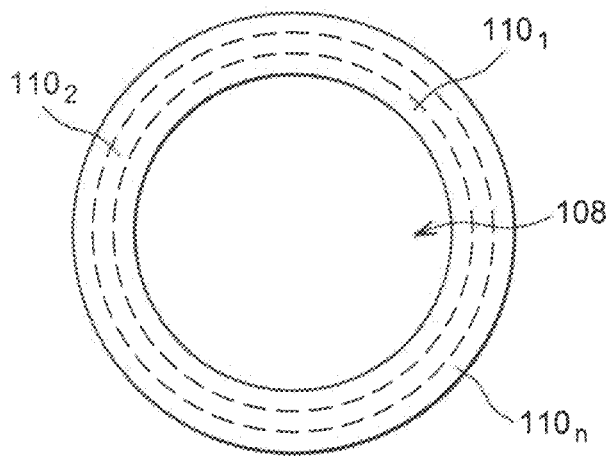

The graphene sheets $110_1 \ldots 110_n$ can be, respectively, a stack of continuous layers surrounding the bar 108 as shown, e.g. in FIG. 2B, or a stack of distinct areas, spread discontinuously around the bar 108 as shown in FIG. 2A (FIGS. 2A and 2B give a cross-sectional view of the bar 108 according to a cross-sectional plane parallel to the main plane of the support 100 in the case given as an example when the bar has a cylindrical shape).

At least one first sheet rigidly attached to the bar 108 is thus formed and which is linked to the latter, as well as a second sheet, which is disconnected from the first sheet or not linked to the first sheet, and can be moved with respect to the bar 108 and the first sheet. The first sheet is thus intended to form, together with the bar 108, a fixed part of the electro-mechanical component, while the second sheet is intended to form a part of the mobile part of the electro-mechanical component.

Figure 1E:
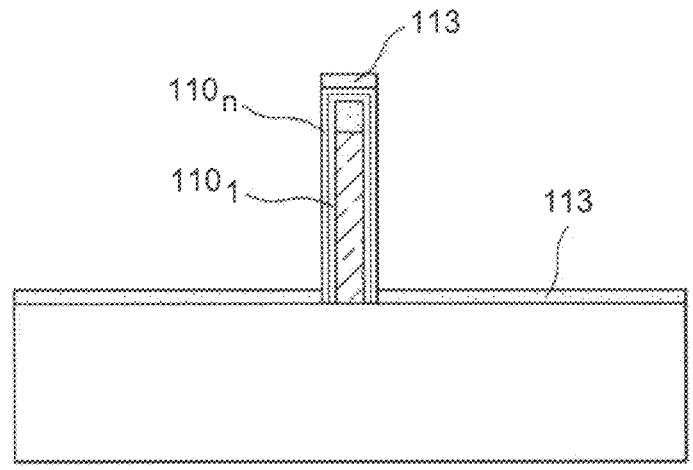

Then (FIG. 1E), a first layer of sacrificial material 113 is formed on the support 100 and on the bar 108. The material 113 can be formed via a non-conformal deposition, so that the material 113 does not overlap the flanks of the bar 108. The thickness of the deposited material 113, can be comprised, e.g. between a few tens and a few hundreds of nanometers. The sacrificial material 113 can be a material chosen for being selectively etched with respect to the material 103 of the bar 108 and the graphene sheets. The sacrificial material 113 can be, e.g. $SiO_2$ in particular in the case where the bar 108 is based on SiC (FIG. 1E).

Figure 1F:
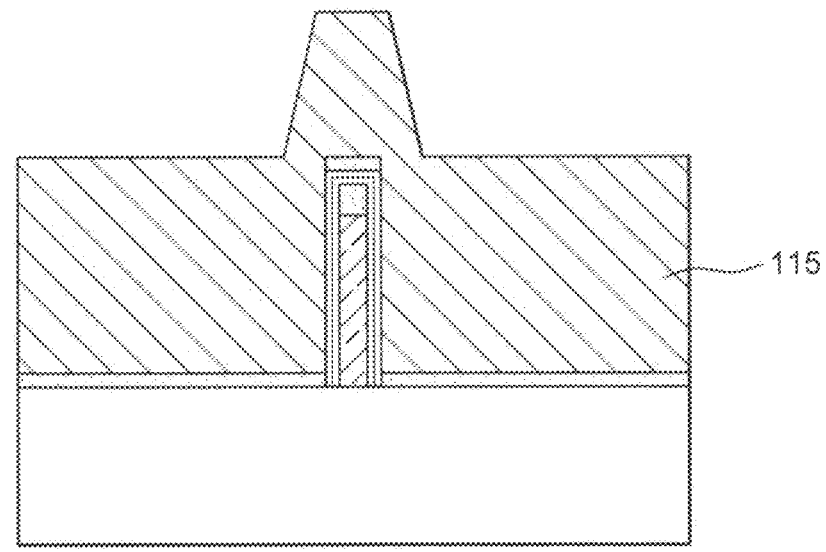

At least one layer of material 115, in which at least one element of a mobile part of the electro-mechanical component is intended to be made, is then formed around the bar 108, and possibly on the bar 108. The material 115 can be, e.g. a metallic material. The material 115 can be deposited on the support 100 and on the element 108, in a thickness which can be comprised, e.g. between a few tens and a few hundreds of nanometers (FIG. 1F).

A step of chemical mechanical polishing (CMP) of the material 115 stopping at the level of the top of the bar 108, and more particularly, just down to the level of the top of the bar 108, can then be carried out, e.g. in the case where the deposited material 115 exceeds the height of the bar 108.

A second layer of sacrificial material 117 resting on the upper side of the bar 108 and on the layer of material 115, is then formed. The second layer of sacrificial material 117 can have a thickness which can be comprised, e.g. between a few tens of nanometers and a few hundreds of nanometers. The sacrificial material 117 can be chosen so that it can be selectively etched with respect to the bar 108, the graphene blades, and the material 115 in which the mobile part is destined to be formed. The sacrificial material 117 can be, for example, $SiO_2$.

Figure 1G:
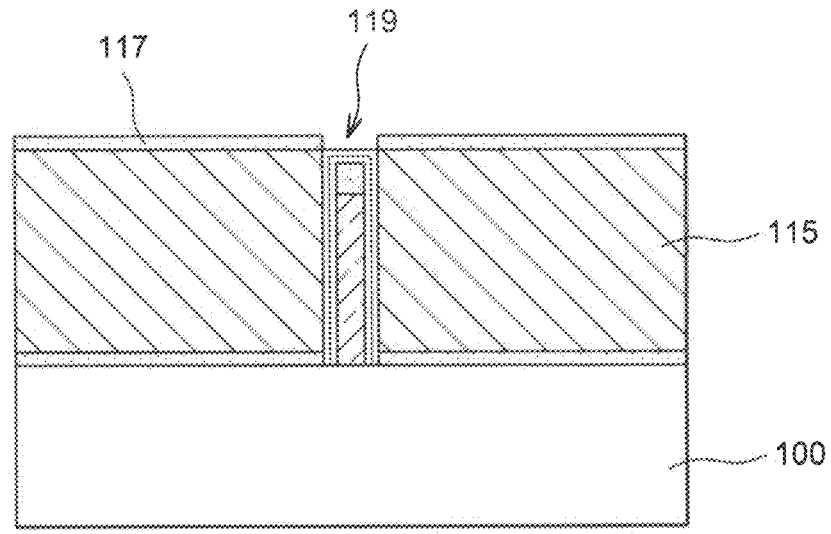

An opening 119 is then made in the layer of sacrificial material 117, so as to reveal the top of the bar 108. The opening 119, can be made by means of photolithographic steps, and by etching the second layer of sacrificial material 117 (FIG. 1G).

A layer of material 125 is then formed in which a protective element of the component, that can be in the form of a cover, will be created. The material 113 and 117 of the sacrificial layers can be selectively etched with respect to this material

125. The material 125 can be, for example, $Si_xN_y$, in particular in cases where the layers of sacrificial material 113 and 117, are made of $SiO_2$.

Figure 1H:
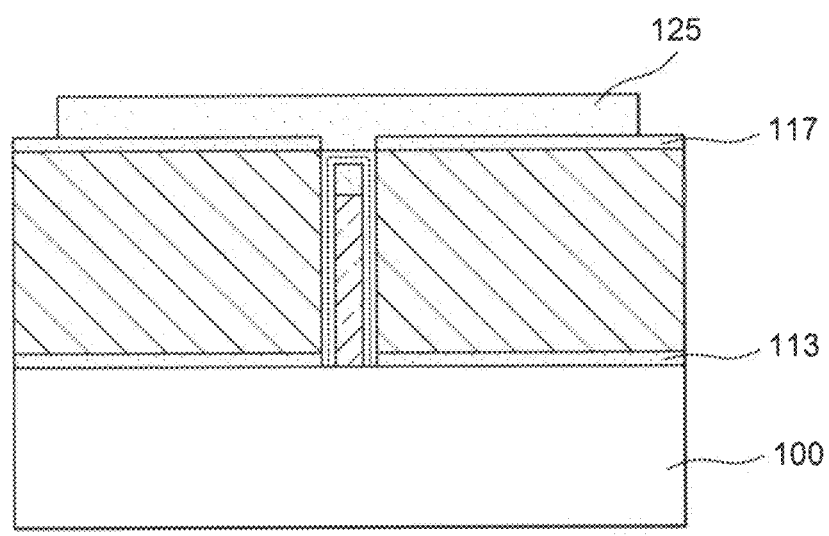
Figure 1I:
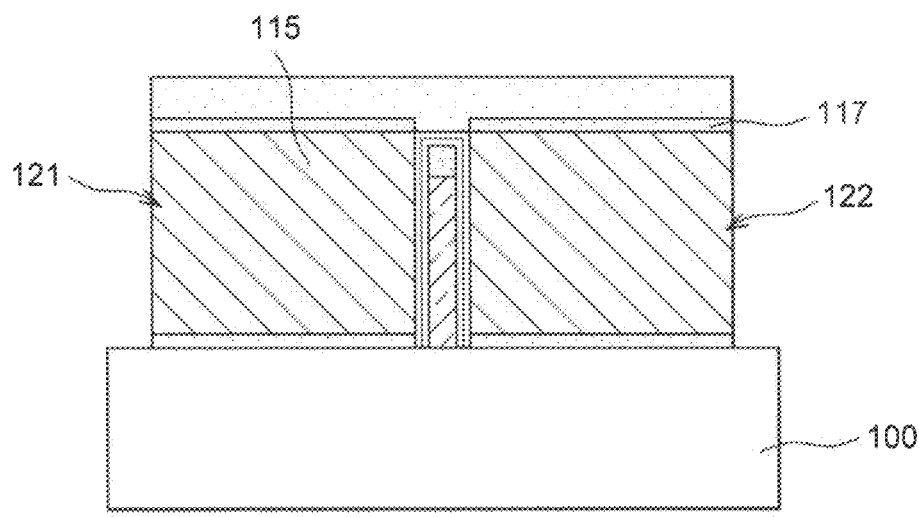

At least one pattern is then formed in the layer of material 125, so as to define the cover. This can be made, for example, by photolithographic steps, then by anisotropic etching of the layer of material 125 (FIG. 1H).

The mobile part is then defined, for example in the form of blades 121, 122, in the layer of material 115. For that, an anisotropic etch of the second layer of sacrificial material 117, of the material 115, of the layer of sacrificial material 113 (FIG. 1I), can be performed.

Figure 1J:
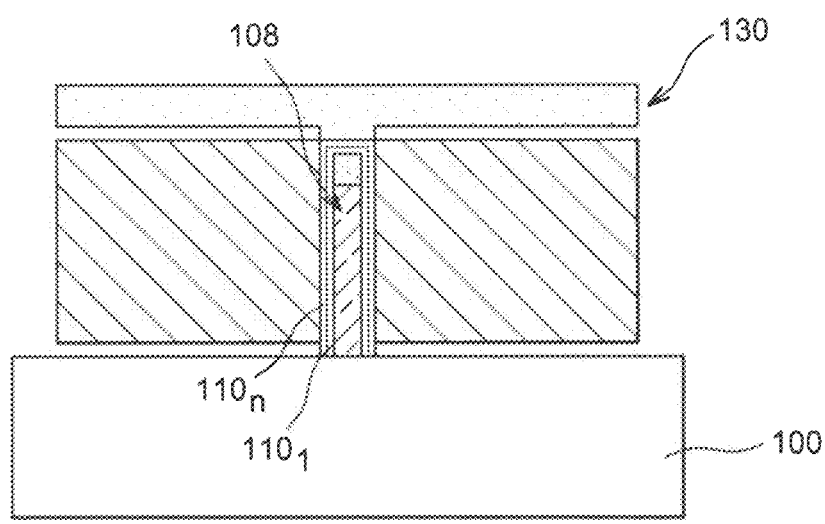

The layers of sacrificial material 113 and 117, are then removed, for example, using HF vapor. The mobile part of the electromechanical component is then freed, for example, in the form of blades 121, 122, of the support 100, and the cover 130 and the blades 121 and 122 are then separated (FIG. 1J).

The means of activating the mobile part (not shown), for example, by electrostatic means of activating, comprising, for example, one or more activating electrodes, or by electromagnetic activating means, can then be produced.

Thus, in this first example of the method, an electromechanical component has been created, equipped with a fixed part in the form of a bar 108 forming an axis of rotation, from the material 103 covered with one or more first sheets of graphene linked to the material 103 of the bar 108. The electromechanical component is also equipped with a mobile part rotating around the bar 108. The mobile part comprises one or more second sheets of graphene that are not linked to the material 102 of the bar 108 and to the first sheets and are able to move around the bar 108.

The second graphene sheet or sheets are fixed with respect to the blades 121, 122 and are destined to turn around at least one part of the bar 108. A holding cover 130 is provided at the top of the bar 108, and can have as function, that of inhibiting the detachment of the blades 121, 122 as well as a protective function.

Certain sheets can be bonded to each other notably for example, by Van de Waals type bonds. In order to allow a free movement of these second sheets with respect to the first sheets, the bonds can be broken, for example, by activating the mobile part of the component. The initiation of the movement of the mobile part can allow the bonds to be broken between the graphene sheet or sheets, linked to the bar 108 and the graphene sheet or sheets of the mobile part, that are fixed to the blades. A free rotation of the mobile part around the bar forming an axis of rotation can then be obtained.

A variant of the embodiment, described previously, will be given with respect to FIGS. 3A-3G (FIGS. 3A-3G show a cross-sectional view of the component being fabricated, only those elements situated in the sectional plane are shown in these figures).

A first layer 102, based on the given material 103 (FIG. 3A), in which a bar 208 based on the given material 103 intended to form a rotation axis of the component, is firstly formed on the support 100. In this example, the produced bar 208 is perpendicular to the main plane of the support 100, and comprises a flared shape with a base 208a resting on the support 100, less wide than the top 208b of same. The bar 208 can be formed with flanks forming an angle α inclined with respect to the normal $\vec{n}$ to the main plane of the support 100.

The bar 208 can be produced by etching the first layer 102 through a mask 105. This etching can be made down right down to the support 100.

Figure 3A:
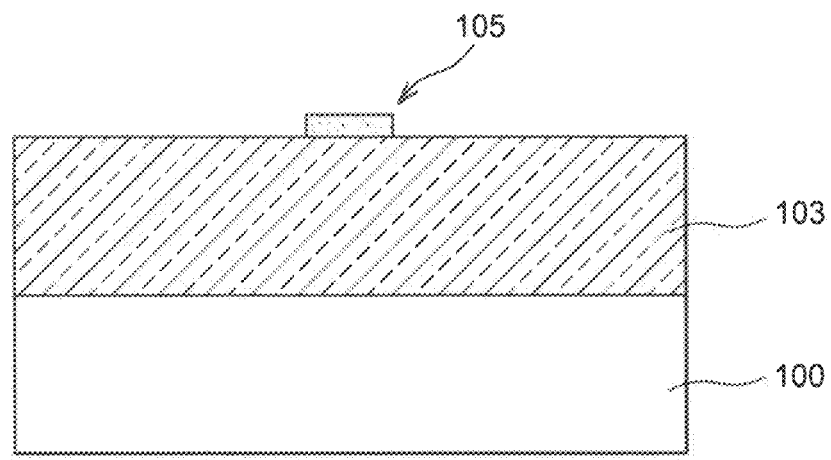
FIGS. 3A-3G illustrate a second example of a method of fabrication on a support of an electro-mechanical component according to the invention, provided with an axis of rotation, orthogonal to the support.
Figure 3B:
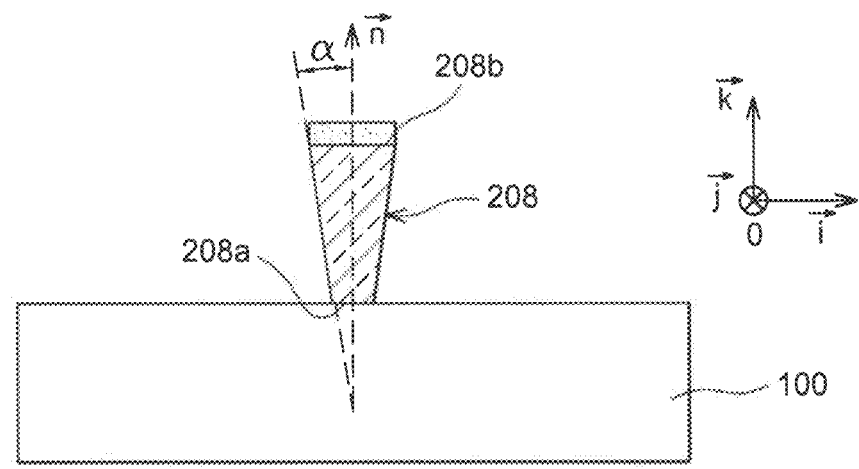
Figure 3C:
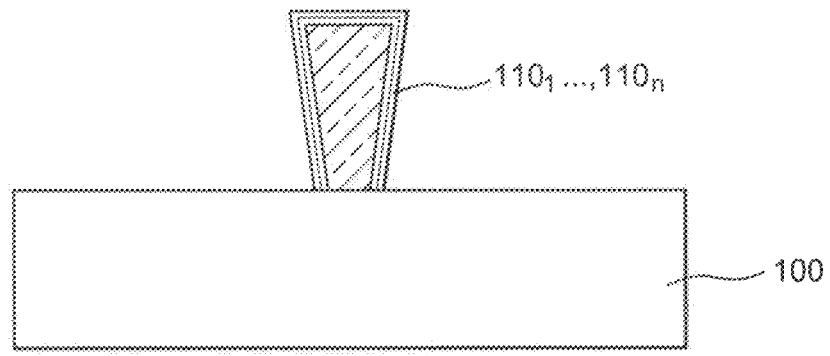

The mask 105 is then removed (FIG. 3B). A rounded profile can then be given to the bar 208, e.g. by carrying out an annealing under a hydrogen atmosphere at a temperature comprised between, e.g. 850° C. and 900° C.

The graphenisation or growth step for the bar 208 (FIG. 3C) is carried out, during which a stack of a few graphene sheets $110_1 \ldots 110_n$ is formed on or from the bar 208, with at least one graphene sheet rigidly attached to the bar 208, and at least a second sheet disconnected from the first graphene sheet and which can be moved with respect to the first sheet.

The flared bar 208 can thus be covered with graphene.

Figure 3D:
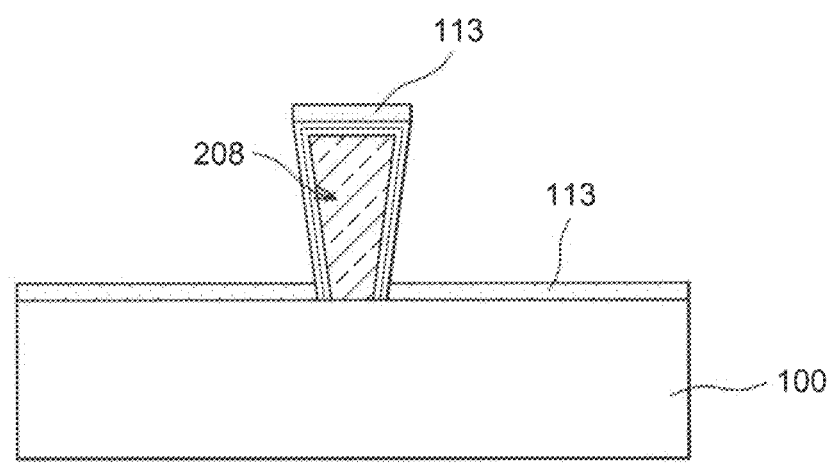
Figure 3E:
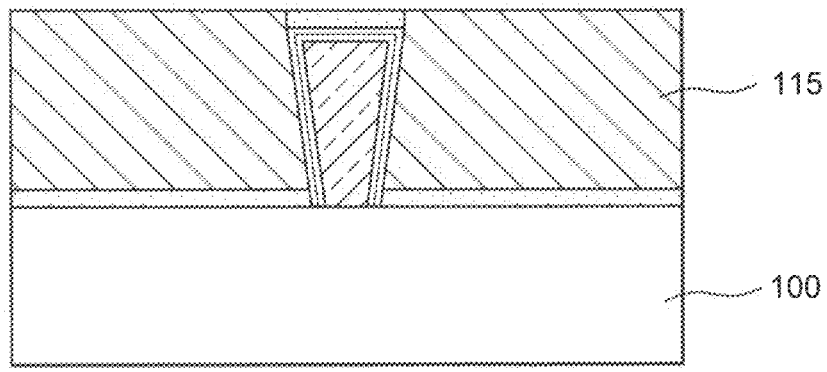

The first layer of sacrificial material 113 is then formed, made, for example, from SiO2, on the support 100 and the bar 208, e.g. via a deposition which is non-conformal and which is produced so as to cover the top of the bar 208 and the support 100, without covering the flanks of the bar 208 (FIG. 3D).

Figure 3F:
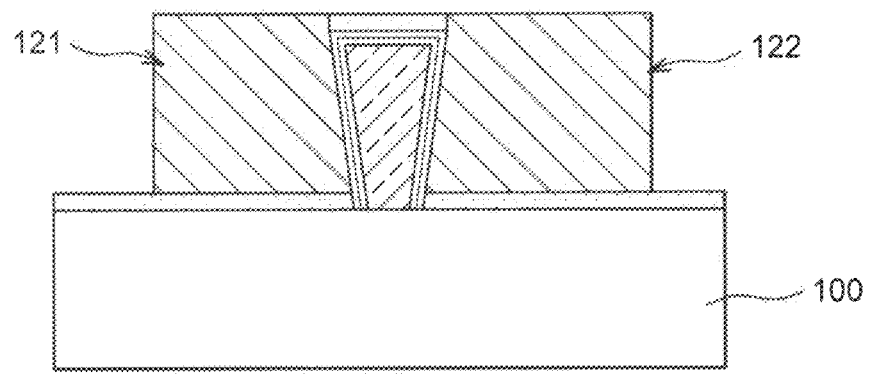

The material 115 in which at least one element of the mobile part of the component is intended to be formed (FIG. 3E), is then deposited around the bar 208. In the case where the material 115 covers the bar 208, a step for polishing the material 115 can be provided Then, the element of the mobile part, e.g. the blades 121, 122, are formed via etching of the material 115 (FIG. 3F).

Figure 3G:
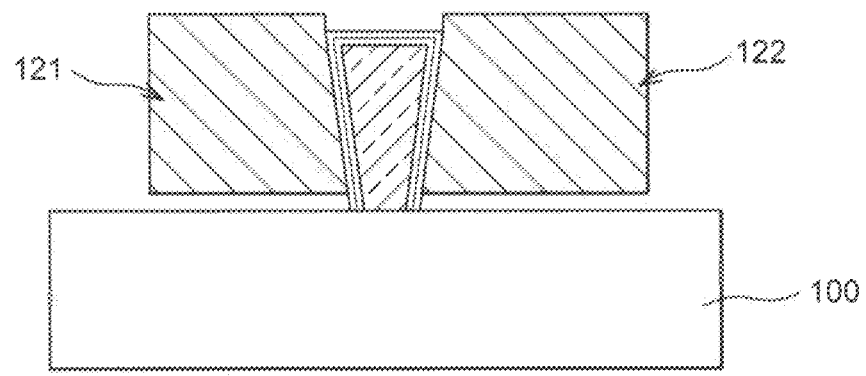

The sacrificial material 113 which is on the top of the bar 208, as well as on the support 100, is then removed in order to free the blades 121, 122 of the support 100 (FIG. 3G).

Figure 4A:
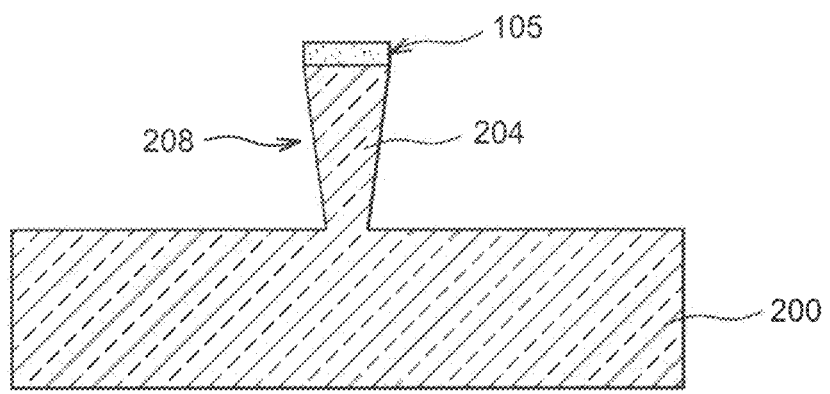
FIGS. 4A-4C illustrate a third example of a method of fabrication on a support of an electro-mechanical component according to the invention, provided with an axis of rotation, orthogonal to the support.
Figure 4B:
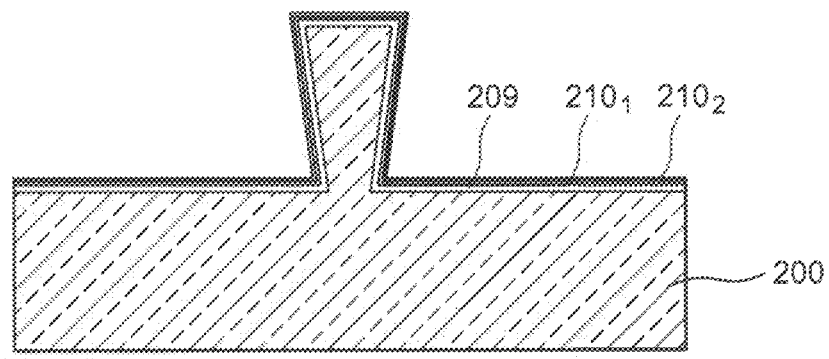
Figure 4C:
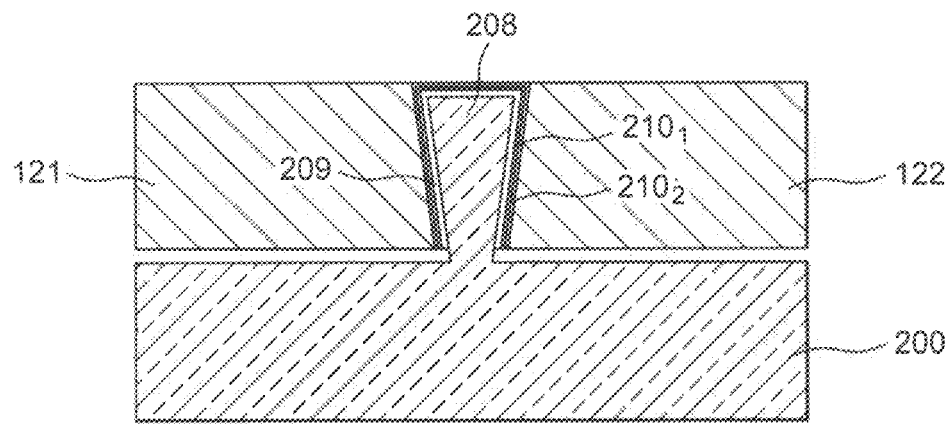

A variant of the example of embodiment previously described will be given in relation to FIGS. 4A-4C (FIGS. 4A-4C show a cross-sectional view of the electro-mechanical component during fabrication, only the elements located within the cross-sectional plane being shown).

A first layer, made from the material 204, which can be chosen namely so that it can be easily modeled and which can enable a rigid structure to be formed, e.g. a semi-conducting material such as Si (FIG. 4A), is first formed on the support 200.

A bar 208 with a flared shape made from the material 204 intended to form the axis of rotation of the component, is then formed in the first layer 202. The produced bar 208 is perpendicular to the main plane of the support 200, and comprises, as in the previous example, a flared shape with a base resting on the support 200, less wide than the top of same.

The bar 208 can be fabricated via the etching of the first layer 204 through a mask 105, e.g. using a $HCl/Br_2/O_2$ or $SF_6/O_2$ plasma. The mask 105 is then removed.

A rounded profile can then be given to the bar 208, e.g. by carrying out an annealing under a hydrogen atmosphere at a temperature comprised between, e.g. 850° C. and 900° C.

A material 209 chosen to be compatible with graphene growth or from which the graphene can be formed, is then formed on the bar 208. Thus, the given material 209 is a material on which or from which one or more graphene layers or sheets, can be formed. The given material 209 can be, e.g. amorphous carbon.

Then, on the given material 209 or from the given material 209, a stack of a plurality of graphene layers or sheets $210_1$, $210_2$ is formed, e.g. such as described in the document: <<Rapid Thermal annealing of amorphous hydrogenated carbon films>>, Alterovitz et al., Meeting of the Materials Research Society, 1987, or the document Yaduda et al., Phys. Stat. Sol. 1986, or the document <<Electrical conductivity of as prepared and annealed amorphous hydrogenated carbon films>>, Reyes-Mena et al., Journal of Vacuum Science Technology, May June 1990 (FIG. 4B).

The material 115 in which at least one element of a mobile part, e.g. blades, is intended to be formed, is then deposited around the bar 208. Then, this element, e.g. these blades 121, 122, are formed by etching the material 115.

A selective etch of the given material 209 with respect to the graphene and the material 115, is then carried out.

Such an etch is carried out in order to suppress the areas of the given material 209 and of the graphene which covers the surface of the support 200, and to free the blades 121, 122 (FIG. 4C).

An example of an embodiment of an electro-mechanical component according to the invention, will now be given in relation to 5A-5I and 6A-6H (FIGS. 5A-5I show a transverse cross-sectional view, while FIGS. 6A-6H show a top view of the component during fabrication).

A first layer 302 based on a given material 303, chosen so that at least one part of the thickness of same can be decomposed and transformed into a plurality of graphene sheets, or chosen so that it can be used as a support for the growth of graphene, is first formed on the support 300. The given material 303 can be, e.g. monocrystalline or polycrystalline SiC.

The first layer 302 can have a thickness comprised between, e.g. a few nanometers and a few tens of nanometers, e.g. comprised between 10 and 500 nm.

The support 300 can comprise an upper layer 301c of a substrate or of a stack of layers resting on a substrate, on which the first layer 302 is produced.

The upper layer 301c is made from a material chosen so that the first layer 302 of the given material 303 can be selectively etched with respect to the upper layer 301c. The upper layer 301c can be made from a semi-conductive material, e.g. such as Si. The upper layer 301c can have a thickness comprised, e.g. between about ten nanometers and about one hundreds of micrometers.

In this example, the upper layer 301c rests on an intermediate layer 301b which can be insulating, e.g. made from $SiO_2$, and with a thickness of the order of about one hundred nanometers. The upper layer 301c is preferably such that it can be selectively etched with respect to the intermediate layer 301b.

Figure 5A:
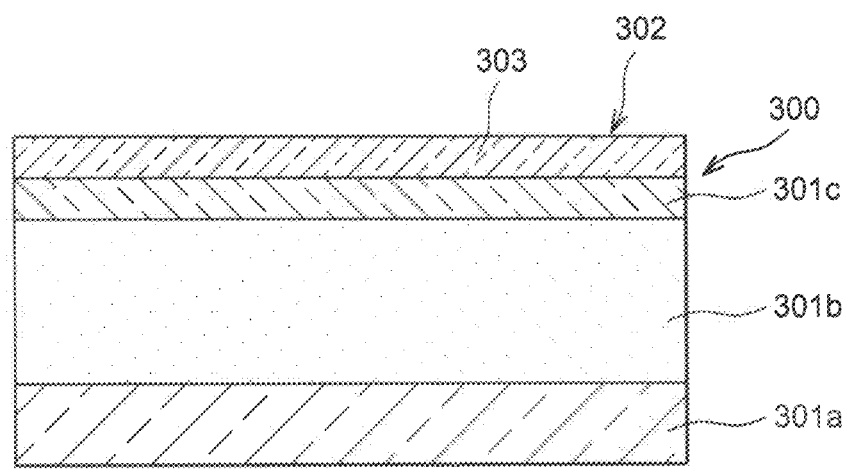
FIGS. 5A-5I, 6A-6H illustrate an example of a method of fabrication on a support of an electro-mechanical component according to the invention, provided with an axis of rotation, parallel to the support.

The intermediate layer 301b rests on a support layer 301a, and can be selectively etched with respect to the support layer 301a. This support layer 301a can be a semi-conductor, e.g. made from Si (FIG. 5A).

Figure 5B:
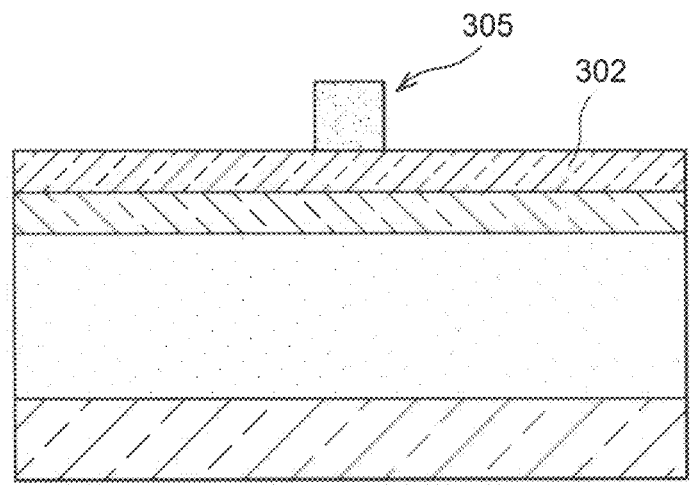
Figure 6A:
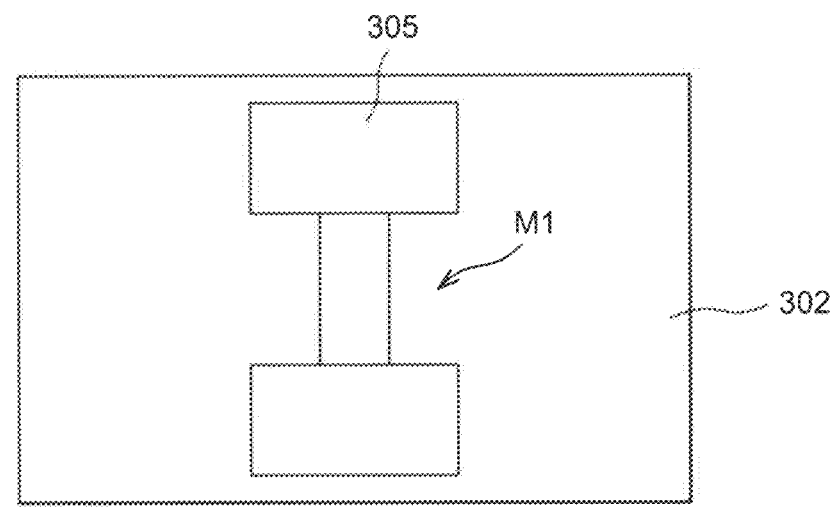
Figure 6B:
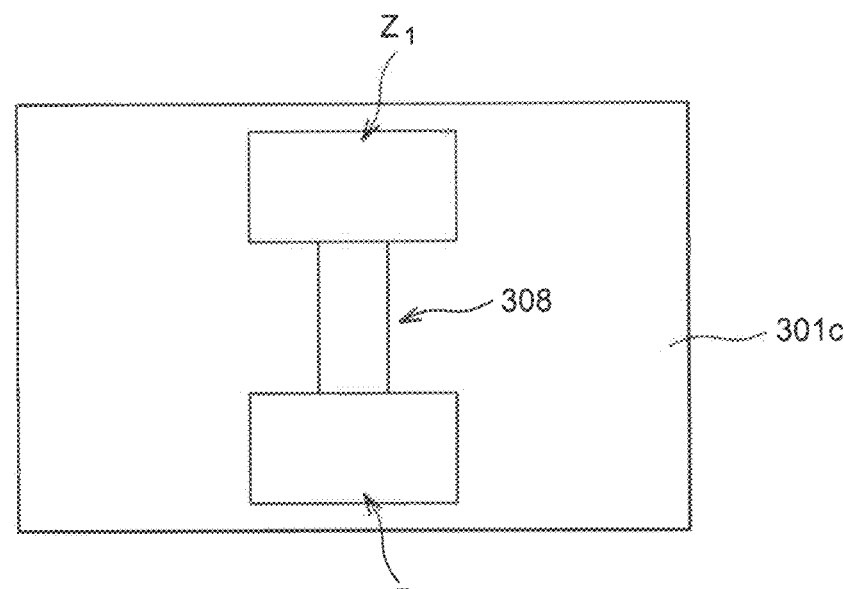
Figure 6B:
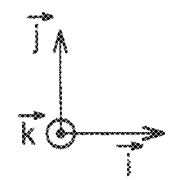
Figure 6C:
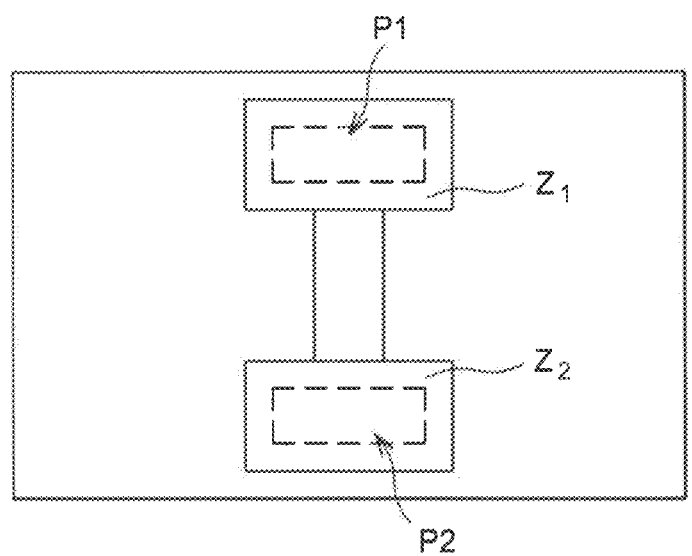

A mask 305, e.g. made of resin or, e.g. from a metal such as aluminum in order to resist an etching step of the first layer 302, is then formed on the first layer 302. The mask 305 comprises a pattern, e.g. such as $M_1$ illustrated on FIG. 6A, comprising an approximately rectangular zone connecting two larger rectangular zones (FIGS. 5B and 6A).

A bar 308 intended to form an axis of rotation of the electro-mechanical component, is then produced in the layer of the given material 303. The bar 308 is produced via the etching of the first layer 302, e.g. via plasma etching such as RIE (<<Reactive Ion Etching>>) or high density etching using, e.g. $CHF_3/O_2$, in particular the etch carried out is an etch of SiC with respect to Si.

Via etching through the mask 305, two areas Z1, Z2 with substantially rectangular shapes, connected by the bar 308, can be formed at the same time as the bar.

The bar 308 thus produced, extends along a direction parallel to the main plane of the support 300, i.e. a plane passing through the support 300 and parallel to a plane [O; $\vec{i}$; $\vec{j}$] of an orthogonal coordinate system [O; $\vec{i}$; $\vec{j}$; $\vec{k}$] defined in FIGS. 5C and 6B.

The bar 308 can be formed with a critical dimension dc comprised between, e.g. a few tens of nanometers and a few hundreds of nanometers, or comprised between 10 nanometers and 10 micrometers. The critical dimension dc is defined as the smallest dimension of the bar 308 measured here along a direction parallel to the main plane of the support 300. This critical dimension can be adapted depending upon the intended application and on the mass that the bar 108 is intended to carry.

A selective removal of the upper layer 301c, with respect to the given material 303 and the intermediate layer 301b, e.g. via isotropic etching, such as wet etching using KOH or TMAH, is then carried out. Portions P1 and P2 (delimitated by discontinuous lines in FIGS. 5D and 6C) of the upper layer 301b, are respectively conserved underneath the zones Z1 and Z2 of the first layer 302, in order to ensure mechanical holding of the stack.

One or more steps are then carried out in order to give a rounded profile to the bar 308. This can be achieved, e.g. using an etching method, e.g. under hydrogen, and/or thermal processing, e.g. via heating at a temperature comprised between 700° C. and 1200° C.

Then, a step for the formation of graphene on the bar 308, in the form of a stack of a plurality of sheets $110_1 \ldots 110_n$, is carried out.

Figure 5C:
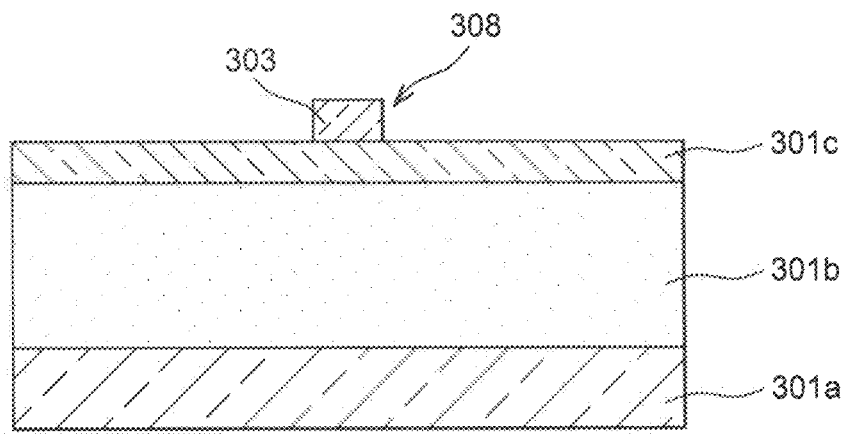
Figure 5C:
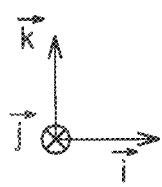
Figure 5D:
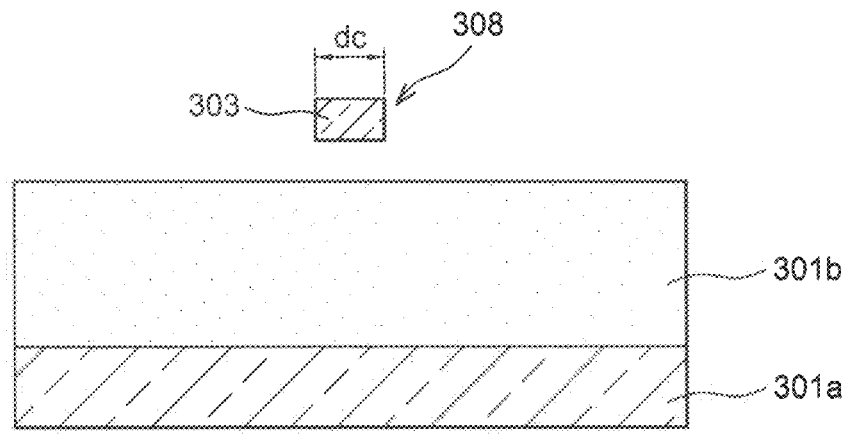
Figure 5E:
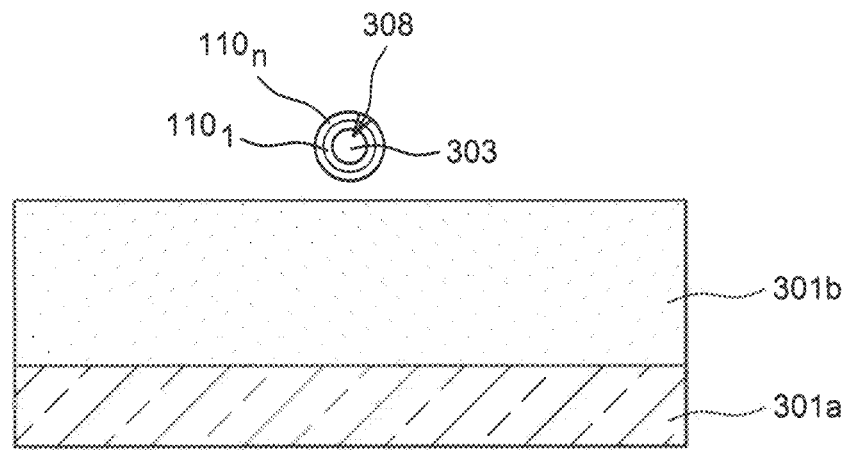
Figure 6D:
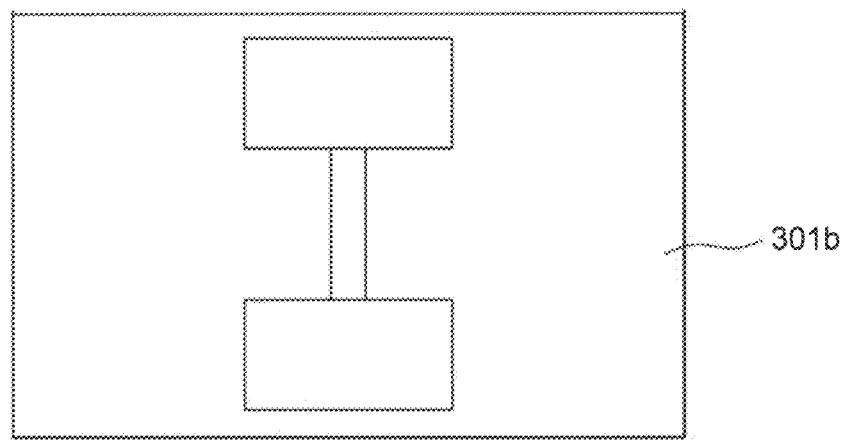

This can be achieved by graphene deposition or growth on the given material 303 (FIGS. 5E and 6D).

A stack of n graphene sheets $110_1 \ldots 110_n$ with n comprised between, e.g. 2 and 100, with a thickness comprised between 0.6 and 40 nanometers, can be produced.

At least two graphene sheets of the stack are separated, so that at least one sheet is rigidly attached to the bar and fixed, and at least a second sheet is mobile with respect to the bar 308.

Figure 5F:
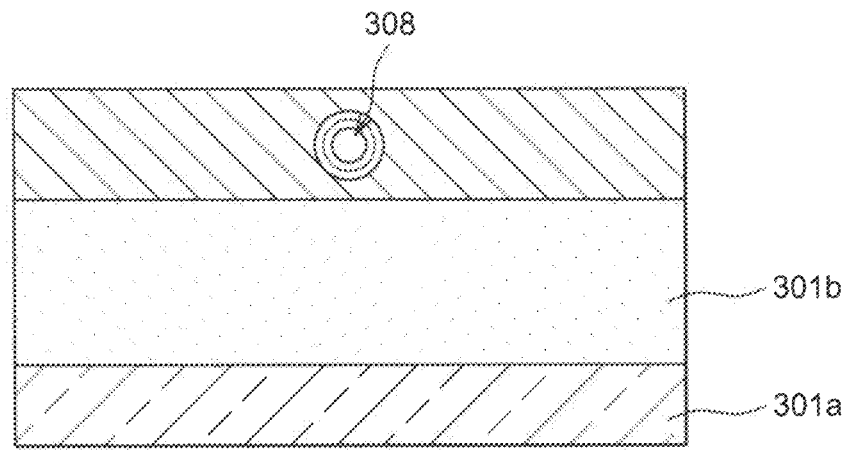
Figure 6E:
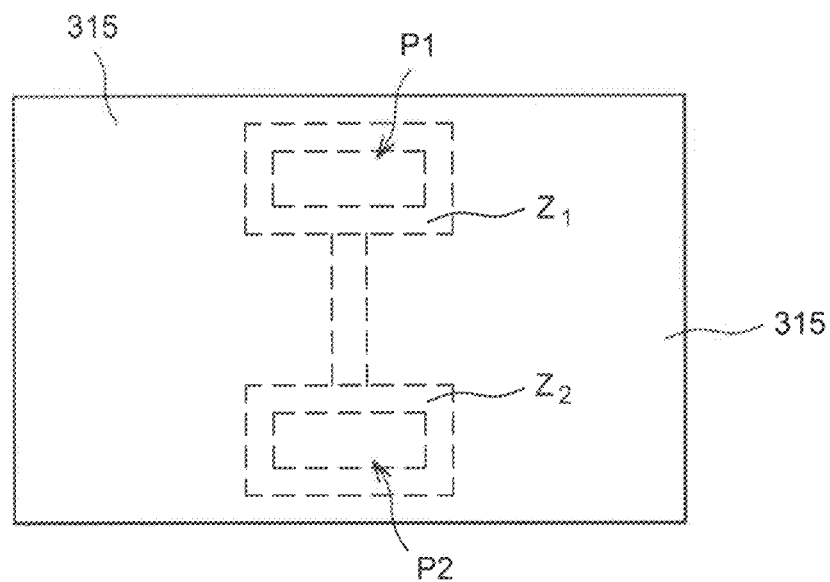

A layer of the material 315, in which an element of the mobile part of the component is intended to be produced, is then formed around the bar 308. The material 315 can be, e.g. a metallic material such as Al, TiN or Ti, which is deposited, e.g. via CVD (Chemical Vapor Deposition) or PECVD (Plasma Enhanced Chemical Vapor Deposition) on the intermediate layer 301b of the support 300 (FIGS. 5F and 6E).

Figure 5G:
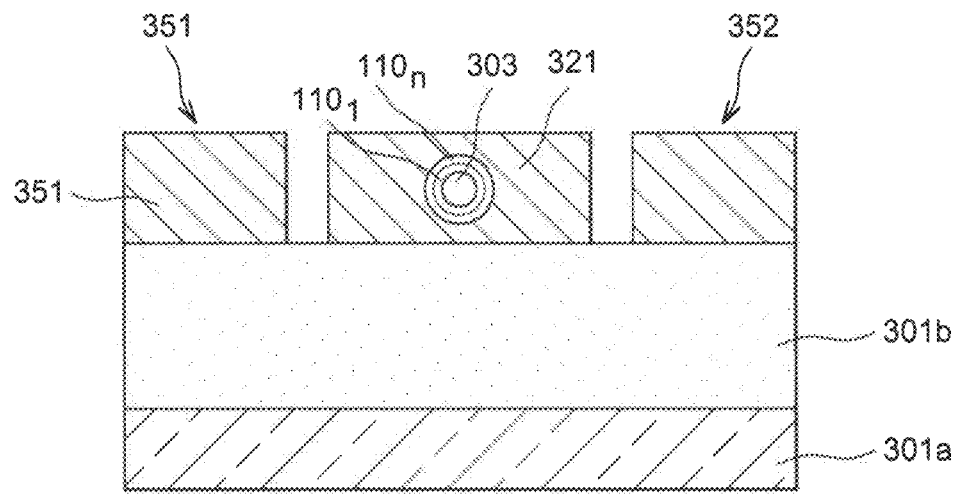
Figure 6F:
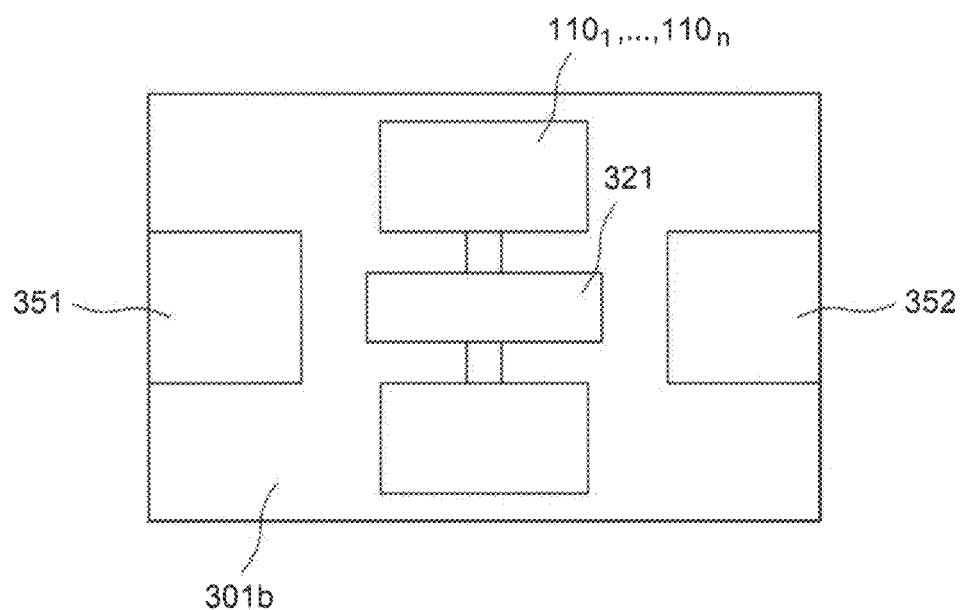

The element 321 of the mobile part of the component is then formed in the material 315. When the material 315 is a metallic material, the actuating electrodes 351, 352 of the mobile part can also be made of material 315, at the same time as the element 321 (FIGS. 5G and 6F). This can be achieved using photolithography, then etching of the material 315, e.g. via plasma etching using a chlorinated element such as $Cl_2$, $BCl_3$, in particular when the material 315 is aluminum.

Figure 5H:
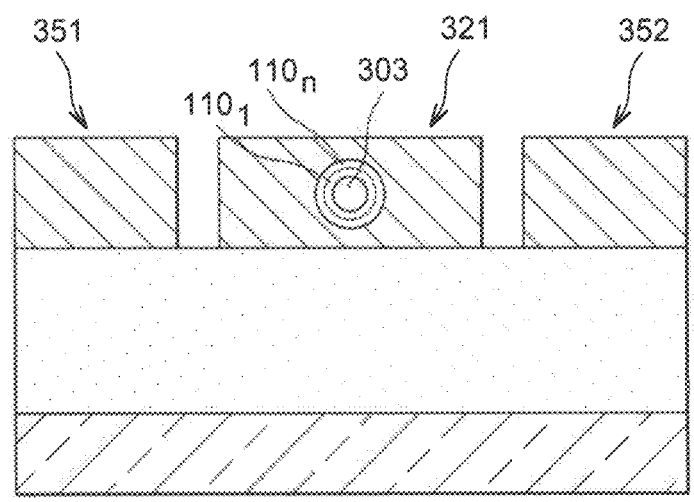
Figure 6G:
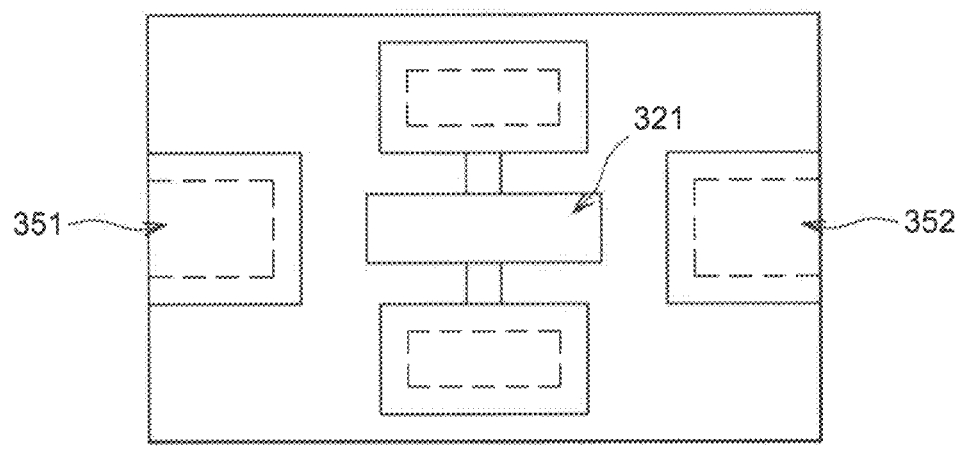
Figure 5I:
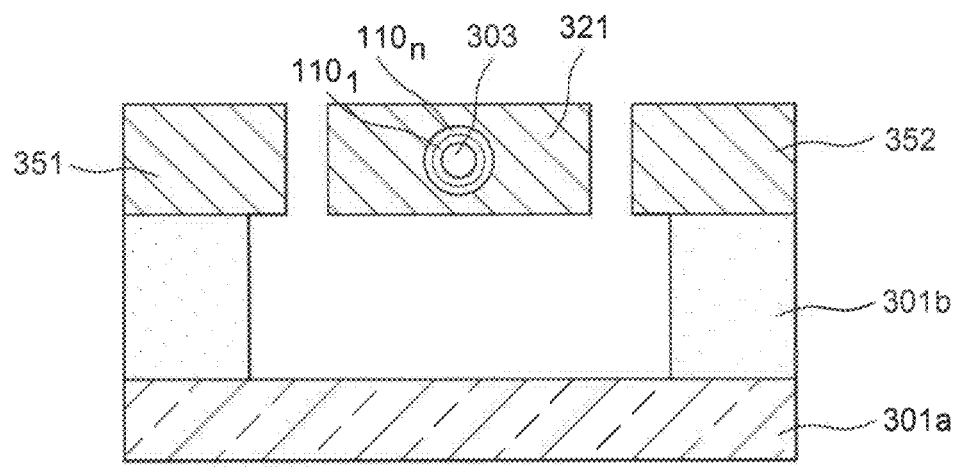
Figure 6H:
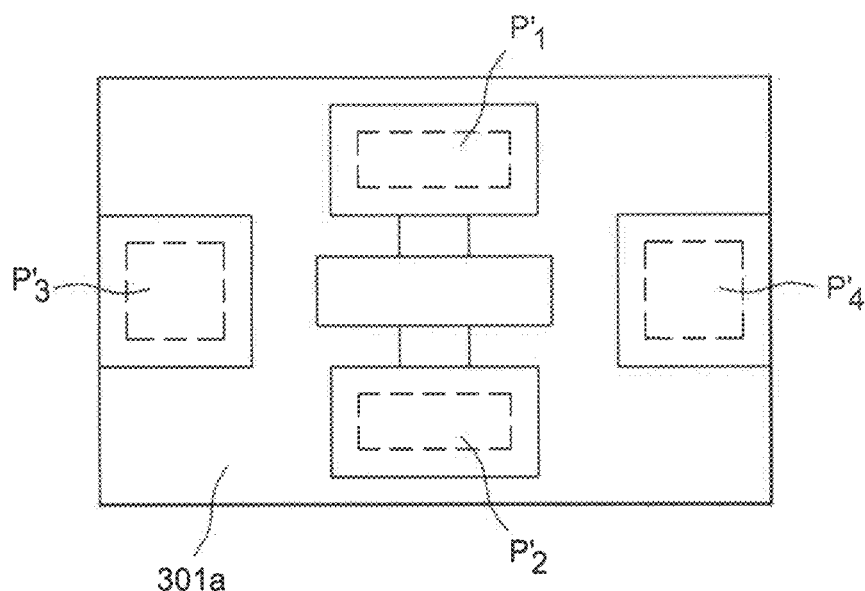

Then, graphene is removed from areas of the structure which are not covered by the material 315 (FIG. 5H and FIG. 6G). This removal can be achieved via etching, which can be selective with respect to the intermediate layer 301b, to the given material 303 and to the material 315. A plasma etch using $O_2$ can be, e.g. implemented for carrying out this removal.

The element 321 is then freed, by etching the intermediate layer 301b through patterns reproduced in the material 315 and in the upper layer 301b. This can be achieved via an isotropic etch, e.g. an etch using liquid HF or vapor HF. The removal can be achieved so that portions P'1, P'2 (delimited by discontinuous lines in FIGS. 5I and 6H) of the intermediate layer 301b are conserved beneath the portions P1 and P2 of the upper layer 301a, and portions P'3, P'4 of the intermediate layer 301b are conserved beneath the electrodes 351, 352 in order to ensure mechanical holding of the stack.

The removal of a portion of the intermediate layer 301b can be achieved so that the element 321 of the mobile part can turn around the bar 308.

In the example of embodiment just given, the bar 308, thus produced, is connected to areas Z1, Z2 of the anchoring blocks which are formed from a same layer as said bar 308, in the same material, which gives the structure increased solidity, in particular at the ends of the bar 308.

A variant of the example of embodiment just described will be given in relation to FIGS. 7A-7L.

Figure 7A:
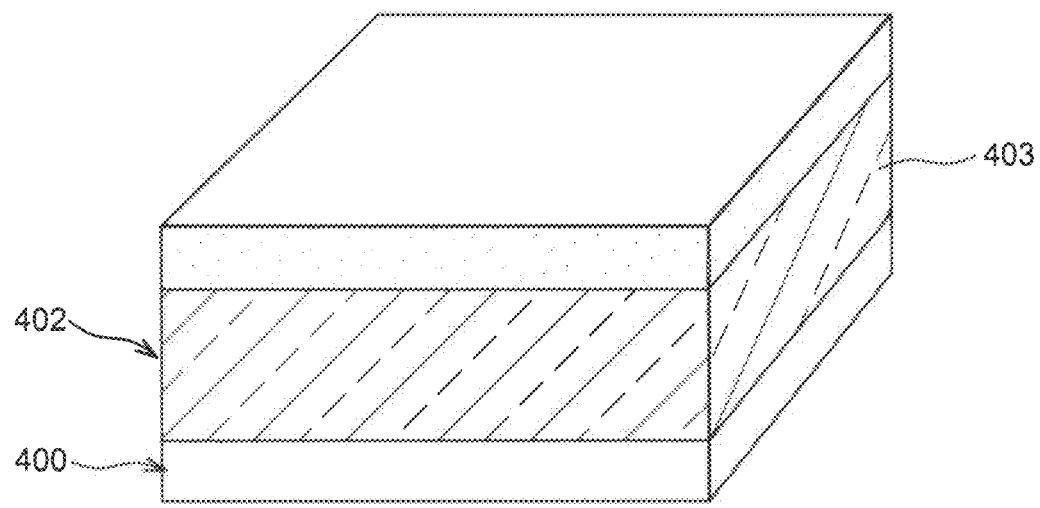
FIGS. 7A-7K illustrate an example of a method of fabrication on a support of an electro-mechanical component according to the invention, provided with an axis of rotation, parallel to the support.

A masking layer, e.g. $Si_xN_y$-based, is formed on the support 400 covered with a first layer 402, made from a material 403 which can be a semi-conductor, e.g. such as Si (FIG. 7A).

Figure 7B:
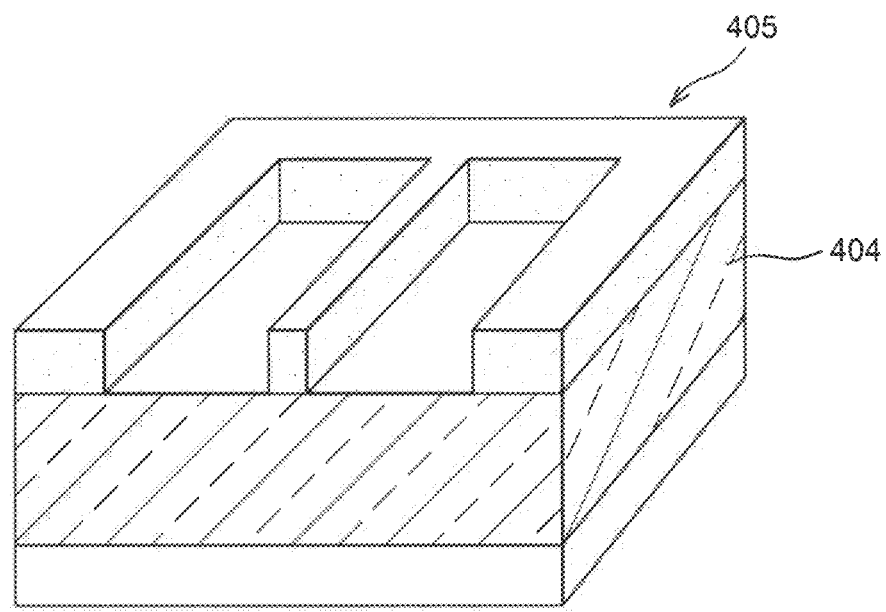

Then, a mask 405 is formed in this masking layer, using, e.g. photolithographic steps and etching is performed (FIG. 7B).

A parallelepiped bar is then formed in the layer 402, via, e.g. anisotropic etching through the mask 405.

Figure 7C:
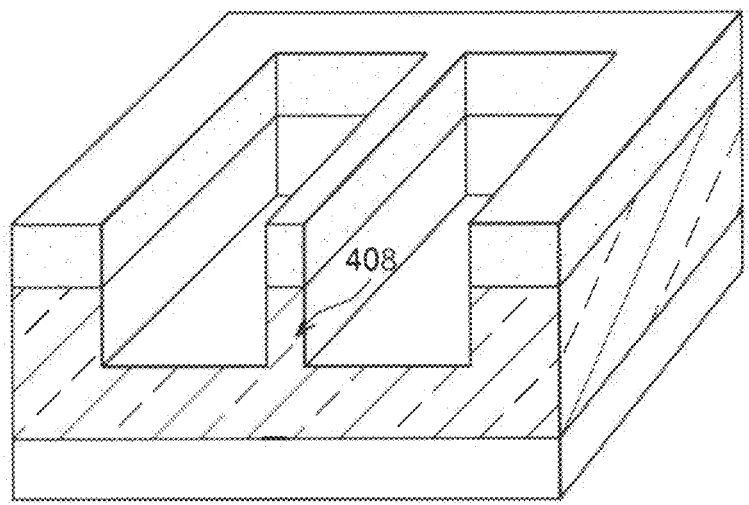

A portion of the silicon layer 402 is thus removed, using, e.g. plasma. The formed bar 408 is located in a cavity 411 and is connected to at least one anchoring block formed in the same layer 402 of the same material 403 as the bar 408 (FIG. 7C).

Figure 7D:
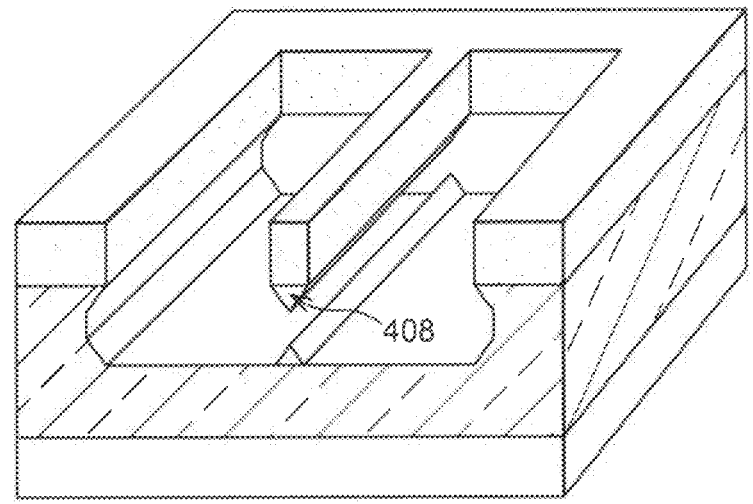
Figure 7E:
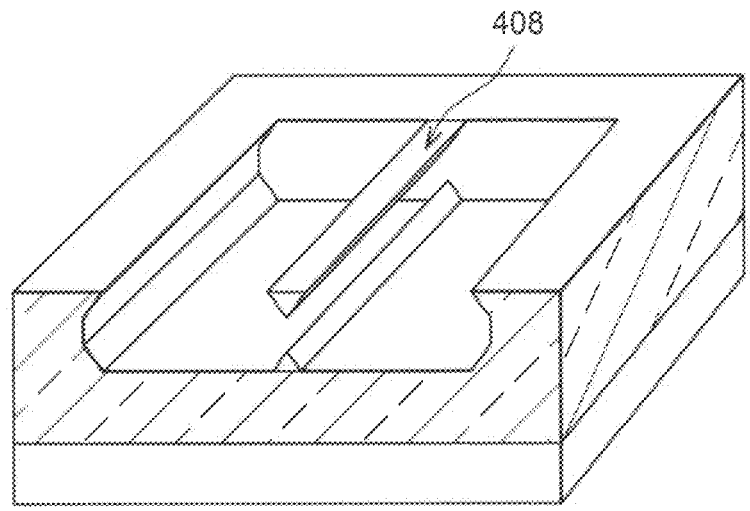
Figure 7F:
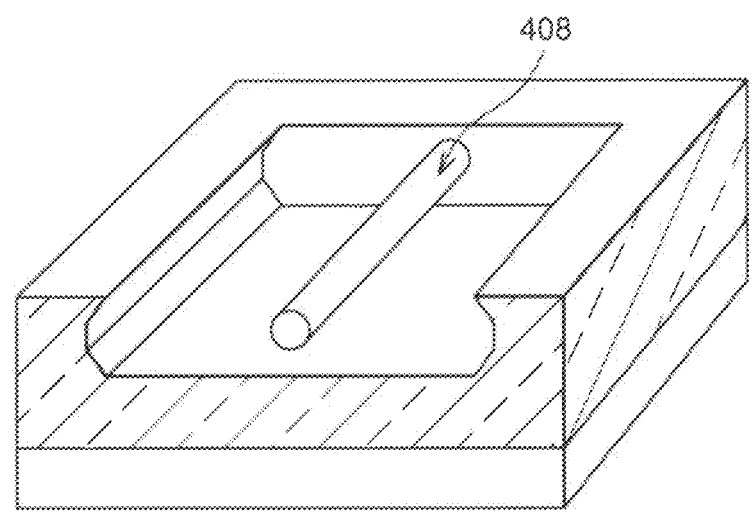
Figure 7G:
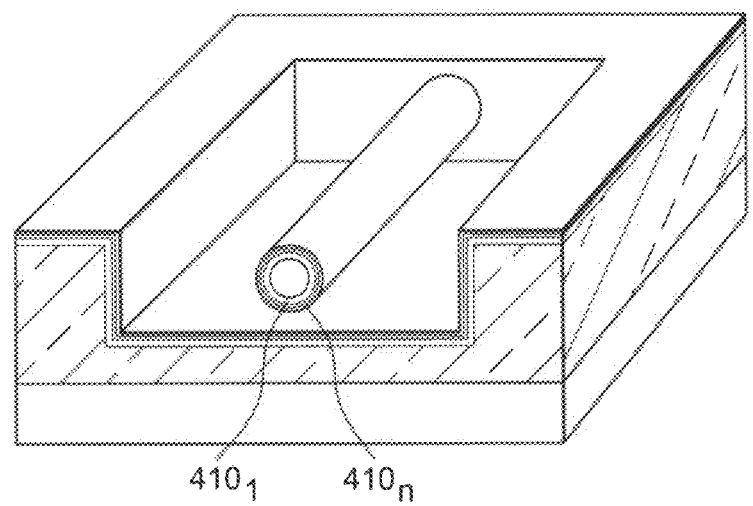
Figure 7H:
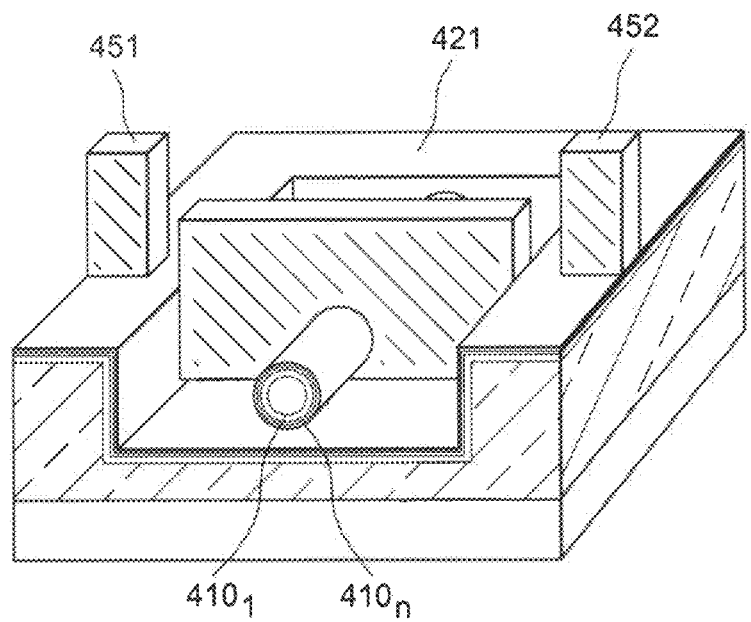

Then, a new etch is carried out, e.g. an isotropic etch of the material 404 through the mask 405, in order to free the bar 408 from the support on which same rested, the bar being maintained suspended inside the cavity 411 by said anchoring block formed in the layer 402 of the material 404. The isotropic etch can be carried out using TMAOH (Tetramethylamoniumhydroxide) which can give a beveled shape to the bar 408 when the latter is Si-based (FIG. 7D).

Then (FIG. 7E), the mask 405 is removed, using, e.g. $H_3PO_4$.

A rounded profile is then given to the bar 408 (FIG. 7F), e.g. by carrying out an annealing under a hydrogen atmosphere at a temperature comprised between, e.g. 850° C. and 900° C.

Then, a given material 409 is formed, on which or from which graphene can be formed in the form of a plurality of sheets $410_1 \ldots 410_n$. The given material 409 can be, e.g. amorphous carbon in the case where graphene is formed from the material 409 or from SiC.

Then, one of the stacked graphene sheets $410_1 \ldots 410_n$ which will be separated in order to conserve at least one graphene sheet rigidly attached to the bar 408, and at least a second sheet disconnected from the first graphene sheet, and which can move with respect to the first sheet (FIG. 7G), are formed on the given material 409 or from the given material 409.

A material 415, which can be metallic, and in which the actuating electrodes 451, 452 are formed, as well as the element 421 intended to form a mobile part rotating around the bar 408, and to be actuated by the electrodes 451, 452 (FIG. 7H) is then deposited around the bar 408.

Figure 7I:
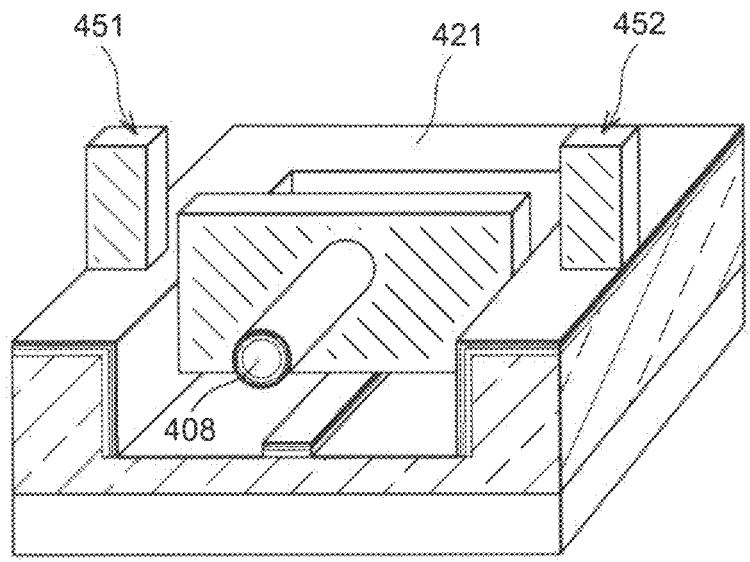

An anisotropic etch of the graphene at the bottom of the cavity 411 is carried out, while the other areas on which graphene has been deposited are protected (FIG. 7I).

This step can be carried out through a resin mask (not shown) which can have the same pattern as the pattern of the mask 405 formed in a subsequent step of the process.

Figure 7J:
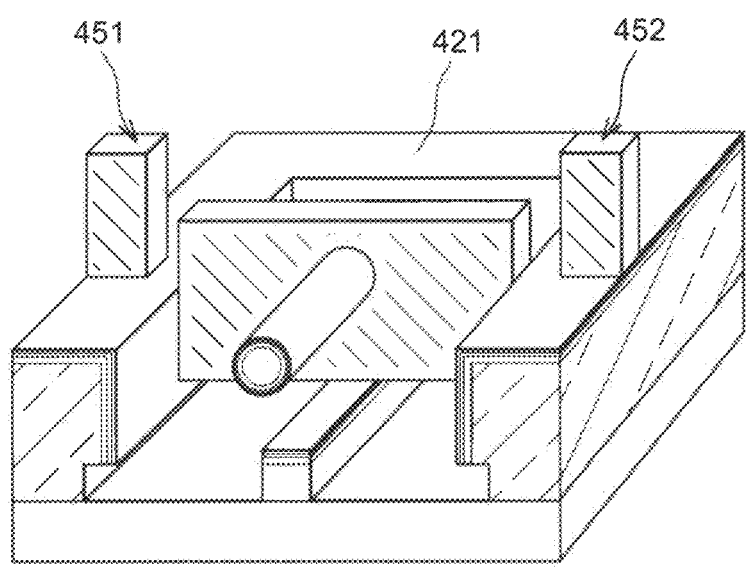

A thickness of the layer on which the element 421 rests, is then removed, via, e.g. etching of the silicon layer 404 (FIG. 7J).

The thickness removed depends upon the movement that the element 421 of the electro-mechanical component is intended to perform, and can be foreseen so that said element 421 can turn around the circumference or the periphery of the bar 408.

Figure 7K:
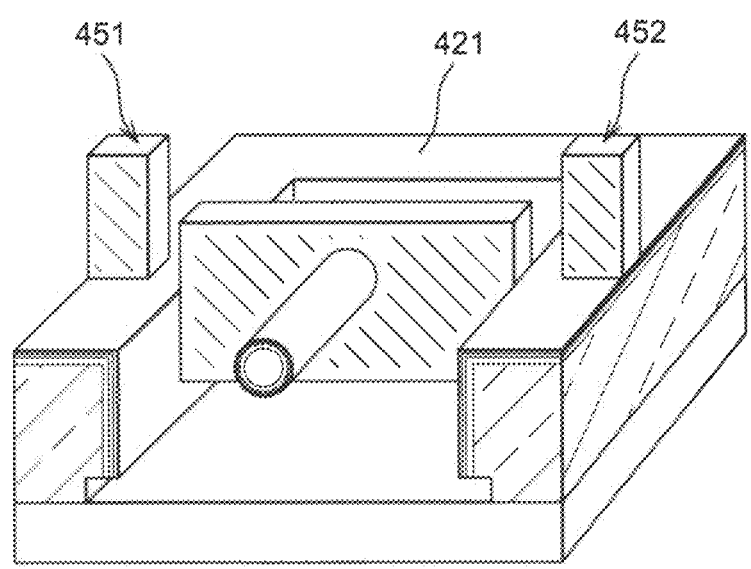

An isotropic etch of the material 404 can then be carried out in order to free the element 421 (FIG. 7K).

Another example of the embodiment of an electro-mechanical component according to the invention for electro-mechanical system, will now be given in relation to FIGS. 8A-8E (FIGS. 8A-8E show a cross-sectional view of the component during fabrication, only the elements located within the cross-sectional plane being shown in these figures).

A mask 505 is then formed on the substrate 500, e.g. a Si-based bulk substrate, or a substrate of the semi-conductor on insulator type substrate such as a SOI-type substrate (SOI stands for Silicon on Insulator), or, e.g. a silicon layer on bulk Si, or, e.g. a layer of SiC on oxide (SiCOI).

Figure 8A:
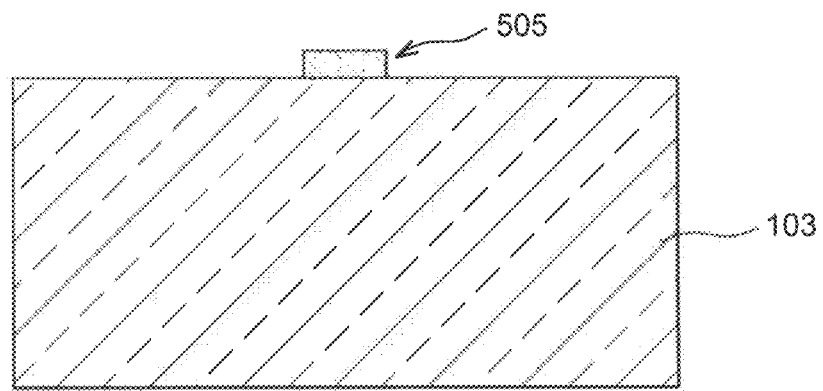
FIGS. 8A-8G illustrate an example of a method of fabrication on a support of an electro-mechanical component according to the invention, provided with an axis of rotation, parallel to the support.

The mask 505 can be produced, e.g. by depositing a masking layer, e.g. $Si_xN_y$-based or resin-based or silicon oxide $Si_xO_y$-based, then etching of this masking layer for defining one or more patterns of the mask (FIG. 8A).

At least one bar 508 intended to form a fixed part of the electro-mechanical component to be made, the bar 508 extending along a direction orthogonal to the main plane of the support 500, is then formed in the support 500.

The bar 508 can be fabricated via anisotropic etching of the parts of the support 500 which are not protected by the mask 505.

Figure 8B:
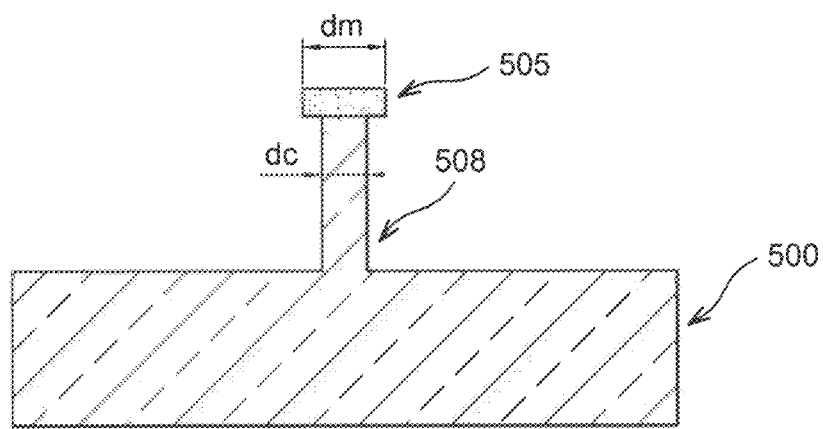
Figure 8C:
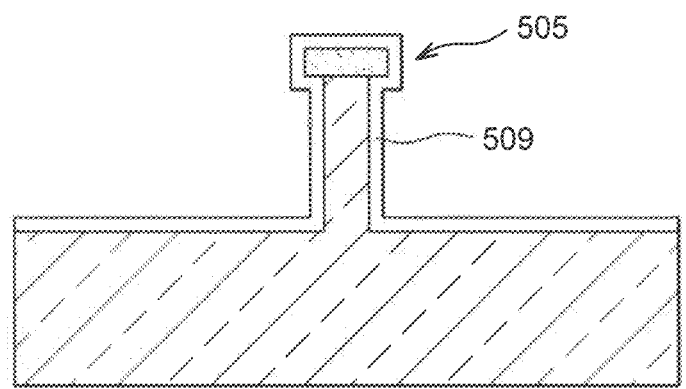

Then, the lateral dimensions of the bar 508 can be reduced i.e. in a plane parallel to the support, in order to give to the bar 508 a critical dimension dc smaller than the critical dimension dm of the mask 505 resting on the bar 508 (FIG. 8B). This lateral reduction of the bar 508 can be carried out, e.g. using an isotropic etch or successive steps of oxidation and deoxidation of the material of the bar when, e.g. the latter is Si-based.

A layer of amorphous carbon 509, which covers the support 500, the flanks of the bar 508 and the mask 505, is then deposited. The amorphous carbon can be conformal.

Figure 8D:
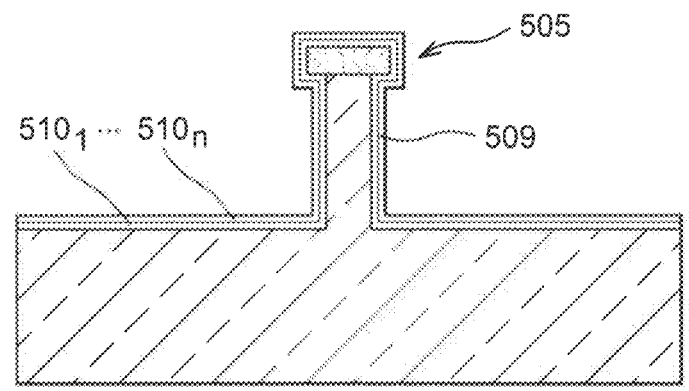

A graphenisation of this layer of amorphous carbon 509 is then carried out, in order to form in this way a stack of a plurality of layers or sheets $510_1, \ldots, 510_n$, at least one sheet $510_1$, and at least one second sheet $510_2$ on the first sheet $510_1$, covering the bar 508 (FIG. 8D).

At least one sheet $510_1$, is thus formed, which is connected with or rigidly attached to the bar 508, and which is intended to form, together with the bar 508, a fixed part of the electro-mechanical component. At least one second free sheet $510_2$, which is disconnected from the first sheet $510_1$, and can be rotated around the bar 508 and around the first sheet $510_1$, the second sheet being intended to form a part of the mobile part of the electro-mechanical component, is thus formed.

Figure 8E:
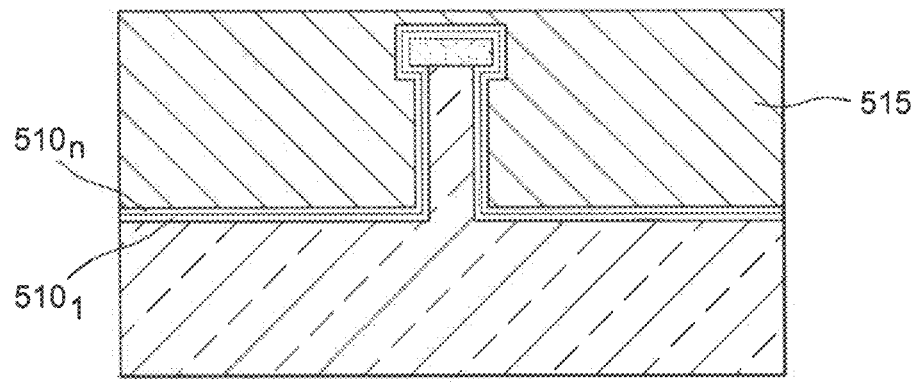

At least one layer of the material 515, in which at least one element of the mobile part of the electro-mechanical part, e.g. in the form of blades, is intended to be fabricated, is then formed around and on the bar 508 covered by the sheets $510_1, \ldots, 510_n$. The material 515 can be, e.g. a metallic material (FIG. 8E).

A chemical mechanical polishing (CMP) step of the material 515 can then be carried out.

Figure 8F:
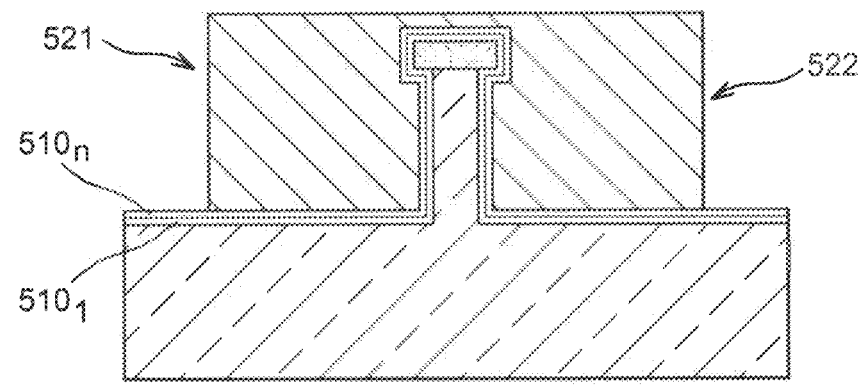

Then, at least one pattern for a mobile part of the structure, e.g. patterns for blades 521, 522 (FIG. 8F), is defined in the material 515.

Figure 8G:
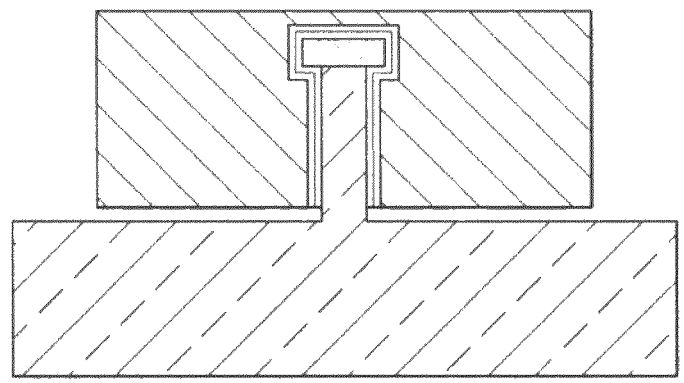
Figure 9:
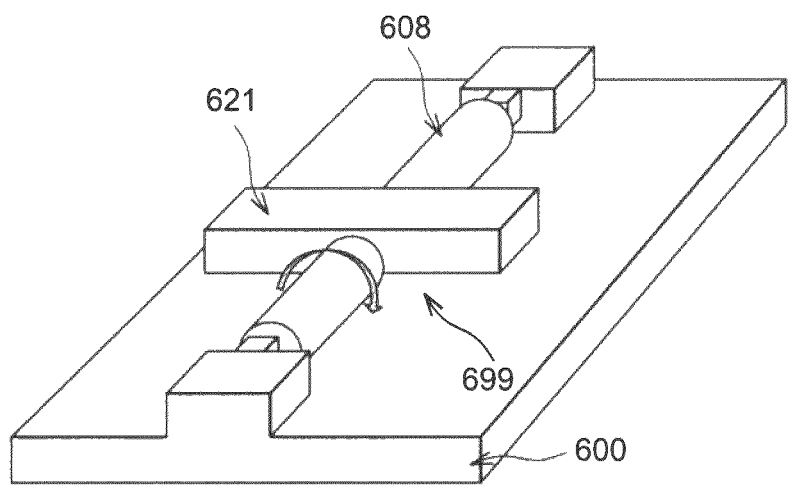
FIG. 9 illustrates an example of a bistable switch formed using an electro-mechanical component according to the invention.

Then, in order to free the mobile part, a selective etching of the portions of the graphene sheets $510_1, \ldots, 510_n$ resting on the support 500 and which are not covered by the material 515 of the blades 521, 522, is carried out. This removal can possibly be extended beneath the blades 521, 522. This selective etch can be carried out, e.g. using a plasma, e.g. an $O_2$ plasma (FIG. 8G).

According to the described various variants, it is possible to:
- implement a method in which at least two sacrificial layers are used, with a first sacrificial layer used for freeing the bar for the fabrication of the blades, a second sacrificial layer used for freeing the structure,
- implement a method in which only one sacrificial layer is used for freeing either the blades, or the global structure,
- implement a method in which the successive liberations are achieved via partial etching of the materials.

An electro-mechanical component such as previously described can have many applications, and can be integrated in any micro-system or nano-system in which a movement of rotation around an axis is implemented.

The electro-mechanical component would enable, e.g. a switch such as an electrical or an optical switch to be formed.

A switch with 2 stable positions out of which one position is implemented, for example, using van der Waals forces, or, for example, using a magnetic force, can be foreseen.

An example of such a switch is given in FIG. 8, with a mobile part comprising a blade 521 forming a rocker, the blade 521 turning around an axis formed by a bar 508 connected to the two anchoring blocks resting on a support 500. An electrostatic actuator for the blade 521 can be provided with one or more electrodes (not shown) located either laterally, on one side and another of the blade, or beneath the blade. A magnetic actuator can also be provided. In this case, the presence of an electrode is not required for a magnetic-type actuating.

Such a component equipped with such a bar and such an arrangement of graphene sheets around the bar, is suitable for the implementation of a rotational movement in which friction is reduced and the energy efficiency is increased. The graphene sheets enable the friction around the rotation axis to be reduced, and the rotation of the mobile element around an axis to be performed without torsion, or with a negligible or very weak torsion of this element forming the rotation axis.

Such a torsion would require the implementation of a return torque which would need to be counter-balanced via the application of various forces for maintaining the switch in a stable position after actuating.

In the present case, maintaining the switch in a stable position can even be implemented using van der Waals forces, e.g. via sticking between the blade and the area 599 on the support 500 which can be sufficient for maintaining the switch in a given stable position without requiring a complementary force, e.g. magnetic or electrical.

With such an arrangement, the electro-mechanical system is more efficient and more robust.

The invention claimed is:

1. A method of fabricating an electro-mechanical micro-system provided with at least one fixed part comprising a bar, and at least one mobile part in rotation around at least one portion of said bar, the method comprising the steps of:
   a) forming in a layer of at least one given material resting on a support at least one bar, and b) forming around the bar a plurality of sheets of graphene of which at least a first graphene sheet, and at least one second graphene sheet, separated from the first sheet and mobile with respect to the first sheet.

2. The method according to claim 1, in which, during step a), etching said layer of said given material is carried out in order to form said bar.

3. The method according to claim 1, in which said given material is a material on which graphene growth can be carried out or of which at least one thickness of said given material is decomposed into graphene.

4. The method according to claim 3, said given material being SiC or copper (Cu) or Nickel (Ni) or iridium (Ir) or platinum (Pt) or ruthenium (Ru) or Palladium (Pd) or amorphous carbon.

5. The method according to claim 1, the bar being fabricated during step a) in order to form a non-zero angle with the main plane of the support.

6. The method according to claim 5, comprising in addition, following step a), and preliminary to step b), etching the bar to form a flared shape from a base of the bar on the support towards a top thereof.

7. The method according to claim 5, in which the bar is formed via etching through a mask with critical dimension larger than a dimension of the bar, during step b) the sheets being produced so as to cover the bar and the mask.

8. The method according to claim 1, said bar is parallel with a main plane of the support.

9. The method according to claim 8, the bar being connected to at least one area of an anchoring block, said area belonging to said layer of given material in which the bar has been formed during step a).

10. The method according to claim 1, further comprising: forming on the bar at least one element of the mobile part rigidly attached to the second graphene sheet.

11. The method according to claim 1, comprising, in addition, between step a) and step b), at least one step consisting of rounding the profile of the bar.

12. The method according to claim 1, at least one of said sheets forming a continuous layer around the bar.

13. The method according to claim 1, the sheets being formed so that the periphery of the bar comprises a plurality of sheets.

* * * * *